US009592572B2

(12) United States Patent
Nirengi et al.

(10) Patent No.: US 9,592,572 B2
(45) Date of Patent: Mar. 14, 2017

(54) ELEMENT MANUFACTURING METHOD AND ELEMENT MANUFACTURING APPARATUS

(71) Applicant: DAI NIPPON PRINTING CO., LTD., Tokyo-to (JP)

(72) Inventors: Takayoshi Nirengi, Tokyo-to (JP); Toshihiko Takeda, Tokyo-to (JP); Hiroyoshi Nakajima, Tokyo-to (JP); Hiroyuki Nishimura, Tokyo-to (JP); Katsunari Obata, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/913,417

(22) PCT Filed: Jul. 31, 2014

(86) PCT No.: PCT/JP2014/070238
§ 371 (c)(1),
(2) Date: Feb. 22, 2016

(87) PCT Pub. No.: WO2015/025692
PCT Pub. Date: Feb. 26, 2015

(65) Prior Publication Data
US 2016/0207146 A1    Jul. 21, 2016

(30) Foreign Application Priority Data

Aug. 20, 2013  (JP) .................................. 2013-170723

(51) Int. Cl.
B23K 26/20    (2014.01)
B23K 26/00    (2014.01)
(Continued)

(52) U.S. Cl.
CPC ........ *B23K 26/206* (2013.01); *B23K 26/0006* (2013.01); *B23K 26/009* (2013.01);
(Continued)

(58) Field of Classification Search
CPC .. B23K 26/20; B23K 26/203; B23K 26/0006; B23K 26/0093; H05B 33/00;
(Continued)

(56) References Cited

U.S. PATENT DOCUMENTS 8,459,561 B2*  6/2013  Aoki ................ G06K 19/07749
235/492
2004/0209442 A1* 10/2004  Takakuwa ........... H01L 27/1214
438/458
(Continued)

FOREIGN PATENT DOCUMENTS

CN    100462240 C    2/2009
JP    2004-079325 A   3/2004
(Continued)

OTHER PUBLICATIONS

Feb. 23, 2016 International Preliminary Report on Patentability issued in International Application No. PCT/JP2014/070238.
(Continued)

*Primary Examiner* — Samuel M Heinrich
(74) *Attorney, Agent, or Firm* — Oliff PLC

(57) ABSTRACT

An element manufacturing method in which a section of a substrate that is irradiated with laser light can be covered efficiently. A plurality of protrusions of an intermediate product are lined up in a first direction on a substrate, and a sealing mechanism includes one pair of rollers that rotate around a rotational axis extending in a second direction orthogonal to the first direction. The paired rollers are lined up spacedly in the first direction. In a sealing step using the sealing mechanism, a section of a lid member that is being
(Continued)

tensioned between the paired rollers is in close contact with a part of the intermediate product. In an irradiation step, light passes through the section of the lid member that is being tensioned between the paired rollers, and reaches the intermediate product.

26 Claims, 9 Drawing Sheets

(51) Int. Cl.
  *H01L 51/50* (2006.01)
  *H01L 51/56* (2006.01)
  *H01L 51/00* (2006.01)
  *H05B 33/10* (2006.01)
  *B41M 5/26* (2006.01)
  *H01L 51/52* (2006.01)
(52) U.S. Cl.
  CPC ...... *B23K 26/0093* (2013.01); *H01L 51/0001* (2013.01); *H01L 51/0015* (2013.01); *H01L 51/50* (2013.01); *H01L 51/56* (2013.01); *B41M 5/26* (2013.01); *H01L 51/00* (2013.01); *H01L 51/5212* (2013.01); *H05B 33/10* (2013.01)
(58) Field of Classification Search
  CPC .......... H05B 33/10; B41M 5/26; H01L 51/00; H01L 51/0001; H01L 51/50; H01L 51/56
  USPC .............. 219/121.63–121.66, 121.6, 121.85; 313/506, 512; 438/25, 82, 99
  See application file for complete search history.

(56) References Cited

U.S. PATENT DOCUMENTS

2006/0132589 A1 6/2006 Kang et al.
2008/0287028 A1 11/2008 Ozawa

FOREIGN PATENT DOCUMENTS

| JP | 2006-175840 A | 7/2006 |
| JP | 2008-288074 A | 11/2008 |
| JP | 2009-087996 A | 4/2009 |
| JP | 4340982 B2 | 10/2009 |
| JP | 2011-009498 A | 1/2011 |
| JP | 2011-113936 A | 6/2011 |
| JP | 2011-151195 A | 8/2011 |
| WO | 2014/157657 A1 | 10/2014 |
| WO | 2014/157658 A1 | 10/2014 |

OTHER PUBLICATIONS

Sep. 2, 2016 Office Action issued in Chinese Patent Application No. 201480041696.0.
Nov. 4, 2014 International Search Report issued in International Patent Application No. PCT/JP2014/070238.
Apr. 7, 2015 Office Action issued in Japanese Patent Application No. 2014-156551.

\* cited by examiner

ELEMENT MANUFACTURING METHOD AND ELEMENT MANUFACTURING APPARATUS

TECHNICAL FIELD

The present disclosure relates to an element manufacturing method and element manufacturing apparatus for manufacturing elements such as organic semiconductor elements.

BACKGROUND ART

Manufacturing processes for such elements as an organic semiconductor element and inorganic semiconductor element are commonly performed under a vacuum environment to prevent impurities from entering the element. For example, sputtering, vapor deposition, or other techniques designed to form films under the vacuum environment are used to form cathodic electrodes, anodic electrodes, and semiconductor layers on a substrate. An internal region of an element manufacturing apparatus is deaerated over a predetermined time using a vacuum pump and other means to realize the vacuum environment.

In the manufacturing processes for the above elements, various steps are executed in addition to a film deposition step. These steps include ones that are traditionally executed under atmospheric pressure. To realize the vacuum environment, on the other hand, the predetermined time is needed as discussed above. Accordingly, when in addition to the film deposition step executed under the vacuum environment the steps executed under atmospheric pressure are further included in the manufacturing processes for such an element, a great deal of time is needed for deaerating the inside of the element manufacturing apparatus or replacing an internal environment of the element manufacturing apparatus with atmospheric air. In light of this factor, it is desirable that the element manufacturing steps be executed under an environment whose pressure is lower than atmospheric pressure. This enables reduction in the time and costs needed to obtain one element.

Examples of steps other than film deposition include the step of removing an organic semiconductor layer positioned on an auxiliary electrode. Patent Document 1, for example, describes such a step. When an electrode disposed on the organic semiconductor layer is a common electrode of a thin-film form, the auxiliary electrode is disposed to suppress a location-by-location difference in magnitude of a voltage drop developed across the common electrode. That is to say, connecting the common electrode to the auxiliary electrode at various locations allows the voltage drop across the common electrode to be reduced. Meanwhile, since the organic semiconductor layer is in general provided over an entire region of the substrate, the above-discussed removal step for removing the organic semiconductor layer on the auxiliary electrode needs to be executed to connect the common electrode to the auxiliary electrode.

A known method for removing an organic semiconductor layer present on an auxiliary electrode is by irradiating the organic semiconductor layer with light such as laser light. In this case, the organic semiconductor material constituting the organic semiconductor layer will fly apart during the removal of the organic semiconductor layer by ablation. To prevent contamination with the organic semiconductor material that has flown apart, therefore, it is preferable that the substrate be covered with some appropriate kind of material. Patent Document 1, for example, proposes a method in which first a counter substrate is overlaid upon the substrate under a vacuum environment to constitute an overlay substrate, next while a space between the counter substrate and the substrate is being maintained under the vacuum atmosphere, the overlay substrate is taken out from the vacuum environment into the atmospheric air, and after this operation, the organic semiconductor layer is irradiated with laser light. Based on a differential pressure between the vacuum atmosphere and the atmospheric air, this method enables the counter substrate to be brought into strong and close contact with the substrate, thereby enabling reliable prevention of contamination with the organic semiconductor material that has flown apart.

PRIOR ART DOCUMENT

Patent Document

Patent Document 1: JP No. 4340982

SUMMARY OF THE INVENTION

The step of irradiating organic semiconductor layers with laser light is commonly performed in order upon each of the organic semiconductor layers formed on the plurality of auxiliary electrodes on the substrate. For example, the organic semiconductor layers on the plurality of auxiliary electrodes are sequentially irradiated with the laser light while one of the optical system, which directs the laser light toward the substrate and guides the laser light to the substrate, and the substrate, is being moved relative to the other. Accordingly, there is no need to cover the substrate over its entire region with the counter substrate for the purpose of preventing the organic semiconductor material from flying apart, and a section of the substrate that is to be irradiated with the laser light needs only to be covered with at least the counter substrate. Meanwhile, as in the invention described in Patent Document 1, when the differential pressure between a vacuum atmosphere and the air is used, the substrate is covered over the entire region with the counter substrate. This leads the apparatus configuration to one that is more complex than actually required. In addition, in the invention described in Patent Document 1, a great deal of time is needed for deaerating the inside of the element manufacturing apparatus or replacing an internal environment of the element manufacturing apparatus with atmospheric air.

An embodiment of the present invention has been made with the above in mind, and an object of the invention is to provide an element manufacturing method and element manufacturing apparatus adapted for efficiently covering the section of a substrate that is to be irradiated with laser light.

An embodiment of the present invention is an element manufacturing method for forming an element on a substrate, the method including the steps of: providing an intermediate product including the substrate and a plurality of protrusions each disposed on the substrate; providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein: the sealing mechanism includes one pair of tensioning members spacedly lined up, and in the sealing step, a section of the lid member that is being tensioned between the paired tensioning members is in close contact with the part of the intermediate product.

In the element manufacturing method according to an embodiment of the present invention, the paired tensioning members of the sealing mechanism may include one pair of rollers and in the sealing step, a section of the lid member that is being tensioned between the paired rollers may be in close contact with a part of the intermediate product.

The element manufacturing method according to an embodiment of the present invention may further include an irradiation step in which a section of the lid member that is being tensioned between the paired tensioning members is irradiated with light. In this case, in the irradiation step, the light may pass through the section of the lid member that is being tensioned between the paired tensioning members, and reach the intermediate product. In addition, in the irradiation step, the lid member being tensioned between the paired tensioning members may be irradiated with the light emitted from a direction of the substrate within the intermediate product.

The element manufacturing method according to an embodiment of the present invention may further include an irradiation step in which a section of the lid member that is being tensioned between the paired tensioning members is irradiated with light, and in the irradiation step, the light may be guided by an optical system fixed with respect to rotation of the paired rollers, pass through the lid member, and reach the intermediate product.

In the element manufacturing method according to an embodiment of the present invention, the sealing mechanism may further include an intermediate film disposed between the paired tensioning members and the lid member, and the intermediate film may be formed from a material having a coefficient of elasticity that is higher than that of a material constituting the lid member.

In the element manufacturing method according to an embodiment of the present invention, the lid member may include a first film, a second film, and a sealing member disposed between the first film and the second film and functioning to seal, from outside, a space present between the first film and the second film, wherein the space between the first film and the second film may be sealed with a gaseous substance in advance and the sealing step may be executed under an environment having a pressure lower than atmospheric pressure.

In the element manufacturing method according to an embodiment of the present invention, the element may include the substrate, a plurality of first electrodes each disposed on the substrate, auxiliary electrodes each disposed between any two of the first electrodes, the protrusions also each disposed between any two of the first electrodes, an organic semiconductor layer disposed on the first electrodes, and a second electrode disposed on the organic semiconductor layer and the auxiliary electrodes, the intermediate product may include the substrate, the first electrodes disposed on the substrate, the auxiliary electrodes and protrusions each disposed between any two of the first electrodes, and the organic semiconductor layer disposed on the first electrodes and the auxiliary electrodes and, the organic semiconductor layer disposed on one of the auxiliary electrodes may be removed while the section of the lid member that is being tensioned between the paired tensioning members is in close contact with a part of the intermediate product.

An embodiment of the present invention is an element manufacturing apparatus for forming an element on a substrate, the apparatus including a support mechanism that supports an intermediate product including the substrate and a plurality of protrusions each disposed on the substrate, a lid member supply mechanism that supplies a lid member having a first surface and a second surface present at an opposite side relative to the first surface, the lid member being provided so that the first surface orients toward the protrusions of the intermediate product, and a sealing mechanism that presses a part of the first surface of the lid member against a part of the intermediate product by abutting the second surface of the lid member, and thereby brings the part of the intermediate product into close contact with the first surface of the lid member, wherein: the sealing mechanism includes one pair of tensioning members; and the paired tensioning members are arranged spacedly so that a section of the lid member that is being tensioned between the paired tensioning members comes into close contact with the part of the intermediate product.

In the element manufacturing apparatus according to an embodiment of the present invention, the paired tensioning members of the sealing mechanism may include one pair of rollers, and a section of the lid member that is being tensioned between the paired rollers may come into close contact with a part of the intermediate product.

The element manufacturing apparatus according to an embodiment of the present invention may further include an irradiation mechanism to irradiate with light a section of the lid member that is being tensioned between the paired tensioning members. In this case, the light may pass through the section of the lid member that is being tensioned between the paired tensioning members, and reach the intermediate product. In addition, the lid member being tensioned between the paired tensioning members may be irradiated with the light emitted from a direction of the substrate within the intermediate product.

The element manufacturing apparatus according to an embodiment of the present invention may further include an irradiation mechanism to irradiate with light a section of the lid member that is being tensioned between the paired tensioning members, wherein the irradiation mechanism may include an optical system that guides the light so that the light will pass through the lid member and reach the intermediate product, and wherein the optical system may be fixed with respect to the rotation of the paired rollers.

In the element manufacturing apparatus according to an embodiment of the present invention, the sealing mechanism may further include an intermediate film disposed between the paired tensioning members and the lid member, and the intermediate film may be formed from a material having a coefficient of elasticity that is higher than that of a material constituting the lid member.

According to the embodiment of the present invention, a substrate can be efficiently covered using an apparatus of a simplified configuration.

MODES FOR CARRYING OUT THE INVENTION

Figure 1:
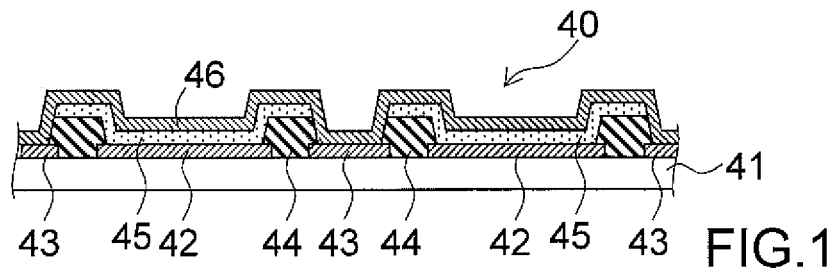
FIG. 1 is a longitudinal sectional view of an organic semiconductor element according to a first embodiment of the present invention.

Hereunder, embodiments of the present invention will be described with reference to FIGS. 1 to 6. In the drawings accompanying the present Description, for the sake of illustration and easier understanding, scales, horizontal to vertical ratios, etc. are exaggeratingly modified from those of the real thing.

A layer configuration of an organic semiconductor element 40 according to an embodiment of the present invention will be first described with reference to FIG. 1. Here, a top-emission type of organic electroluminescent (EL) element will be described as an example of the organic semiconductor element 40.

Organic Semiconductor Element

As shown in FIG. 1, the organic semiconductor element 40 includes a substrate 41, a plurality of first electrodes 42 each disposed on the substrate 41, auxiliary electrodes 43 and protrusions 44 each disposed between any two of the first electrodes 42, organic semiconductor layers 45 each disposed on one of the first electrodes 42, and a second electrode 46 disposed on the organic semiconductor layers 45 and on the auxiliary electrodes 43.

The organic semiconductor layers 45 each include at least a light-emitting layer that emits light by recombinations of electrons and holes in organic compounds. Each organic semiconductor layer 45 may further include a hole injection layer, a hole transport layer, an electron transport layer or an electron implantation layer, and other layers generally provided in an organic EL element. Constituent elements of the organic semiconductor layer can be known ones, for example the elements described in JP2011-9498A.

One first electrode 42 is disposed for each of the organic semiconductor layers 45. The first electrode 42 also functions as a reflecting electrode to reflect the light that has been generated from the organic semiconductor layer 45. Examples of a material constituting the first electrode 42 can include aluminum, chromium, titanium, iron, cobalt, nickel, molybdenum, copper, tantalum, tungsten, platinum, gold, silver, and other metallic elements, whether they be used independently or in combination as an alloy.

The second electrode 46 functions as a common electrode with respect to the plurality of organic semiconductor layers 45. In addition, the second electrode 46 is configured to transmit the light that has been generated from the organic semiconductor layers 45. Examples of a material constituting the second electrode 46 can include a metallic film that has been thinned to such an extent that it can transmit the light, and an oxide conductive material such as indium tin oxide (ITO).

The auxiliary electrodes 43 are provided to suppress variations in voltage drop due to differences in distances from a power supply (not shown) to individual organic semiconductor layers, and thus to suppress a variation in luminance of a display device which uses the organic EL element. As shown in FIG. 1, each auxiliary electrode 43 is connected to the second electrode 46. Examples of a material constituting the second electrode 46 can include substantially the same metallic elements as those which are each used alone in the first electrode 42 or in combination as an alloy. The auxiliary electrodes 43 may be formed from the same material as that of the first electrode 42, or may be formed from a material different from that of the first electrode 42.

The protrusions 44 are constructed of a material having an electrical insulating property. In the example of FIG. 1, the protrusions 44 are each disposed between one first electrode 42 and one auxiliary electrode 43. Disposing each such protrusion 44 enables electrical insulation between the first electrode 42 and the auxiliary electrode 43, and between the first electrode 42 and the second electrode 46. The disposition of each protrusion 44 also enables appropriate definition of a shape of the organic semiconductor layers 45 each disposed between any two of the protrusions 44. Examples of a material constituting the protrusions 44 can include an organic material such as polyimide, and an inorganic insulating material such as silicon oxide. In addition, the protrusions 44 extend in a normal-line direction of the substrate 41 and thus when a lid member described later herein is brought into close contact with the substrate 41, the protrusions can also be made to function as spacers to ensure a space between the lid member and the substrate 41.

As shown in FIG. 1, the organic semiconductor layers 45 and the second electrode 46 may be continuously disposed on the protrusions 44 as well as on the first electrodes 42. Of each organic semiconductor layer 45, only a region sandwiched between one first electrode 42 and the second electrode 46 upward and downward allows an electric current to flow through and emits light, and regions of the organic semiconductor layer 45 that are positioned on the protrusions 44 do not emit light. Only the region of the organic semiconductor layer 45 that emits the light, that is, the organic semiconductor layer 45 disposed on the first electrode 42, is shown in FIGS. 2A and 2B that are described later herein.

Next, construction of the organic semiconductor element 40 when viewed from the normal-line direction of the substrate 41 is described below. The description focuses particularly upon layout of the auxiliary electrodes 43, protrusions 44, and organic semiconductor layers 45 of the organic semiconductor element 40. FIG. 2A is a plan view of an exemplary layout of the auxiliary electrodes 43, the protrusions 44, and the organic semiconductor layers 45. As shown in FIG. 2A, the organic semiconductor layers 45 may be arranged sequentially in matrix form and each may include a rectangular, red organic semiconductor layer 45R, green organic semiconductor layer 45G, and blue organic semiconductor layer 45B. In this case, the red organic semiconductor layer 45R, the green organic semiconductor layer 45G, and the blue organic semiconductor layer 45B each constitute a sub-pixel. In addition, a combination of adjacent organic semiconductor layers 45R, 45G, and 45B constitutes one pixel.

Figure 2A:
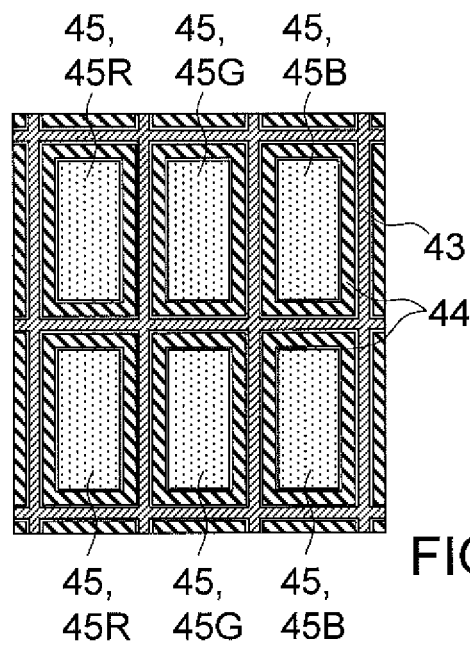
FIG. 2A is a plan view of an exemplary layout of auxiliary electrodes, protrusions, and organic semiconductor layers of the organic semiconductor element shown in FIG. 1.
Figure 2B:
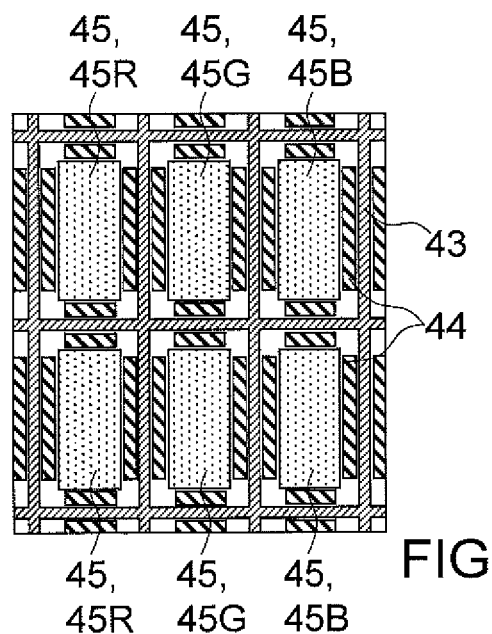
FIG. 2B is a plan view of an another exemplary layout of the auxiliary electrodes, protrusions, and organic semiconductor layers of the organic semiconductor element shown in FIG. 1.

As shown in FIG. 2A, the auxiliary electrodes 43 are arranged in grid form in such a way as to extend between the organic semiconductor layers 45 arranged in the matrix form. Location-specific differences in magnitude of the voltage drop across the second electrode 46 connected to the organic semiconductor layers 45 can be suppressed by arranging the auxiliary electrodes 43 in this way. Additionally, as shown in FIG. 2A, the protrusions 44 are each disposed between one organic semiconductor layer 45 and one auxiliary electrode 43 so as to surround the organic semiconductor layer 45 disposed on the first electrode 42 from the side thereof. In other words, each protrusion 44 is continuously disposed along four sides of the organic semiconductor layer 45 disposed on the first electrode 42. Thus, the organic semiconductor material that may have flown apart in the step of removing the organic semiconductor layer 45 positioned on the auxiliary electrode 43 can be prevented from reaching the organic semiconductor layer 45 on the first electrode 42.

As long as the voltage drop can be appropriately reduced, the auxiliary electrode 43 does not need to be connected to the second electrode 46 over an entire region of the auxiliary electrode 43. That is to say, not all of the organic semiconductor layer 45 on the auxiliary electrode 43 requires removal in the removal step detailed later herein. As shown in FIG. 2B, therefore, the protrusion 44 may be discontinuously disposed along any one of the four sides of the organic semiconductor layer 45. In the example of FIG. 2B as well, the organic semiconductor material that may have flown apart in the step of removing the organic semiconductor layer 45 on the auxiliary electrode 43 positioned between two protrusions 44 can be prevented from reaching the organic semiconductor layer 45 on the first electrode 42 which organic semiconductor layer 45 is at least partially positioned between two protrusion 44. In addition, the voltage drop can be appropriately suppressed by connecting the auxiliary electrode 43 positioned between the two protrusions 44 to the second electrode 46.

Figure 2C:
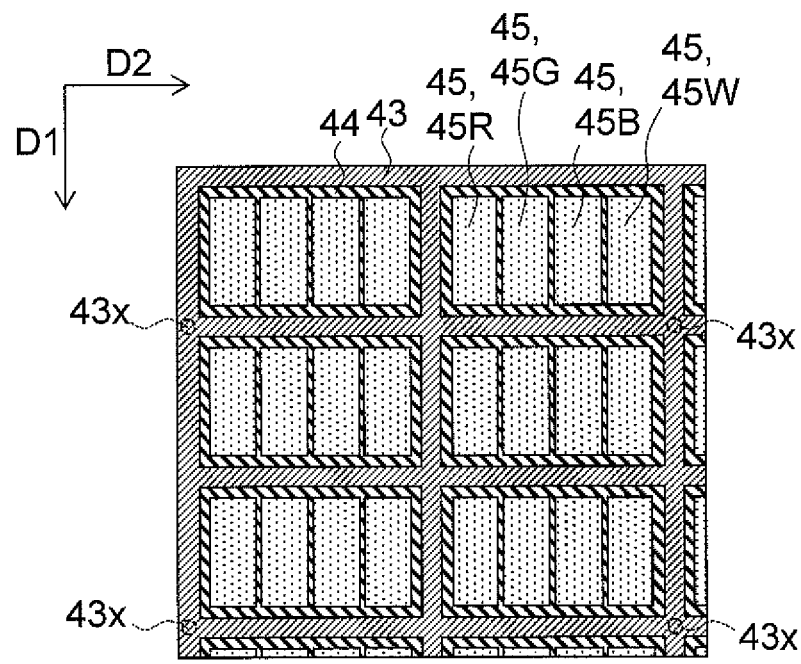
FIG. 2C is a plan view of an example of a section of the organic semiconductor layers which is to be removed on the auxiliary electrodes.
Figure 2D:
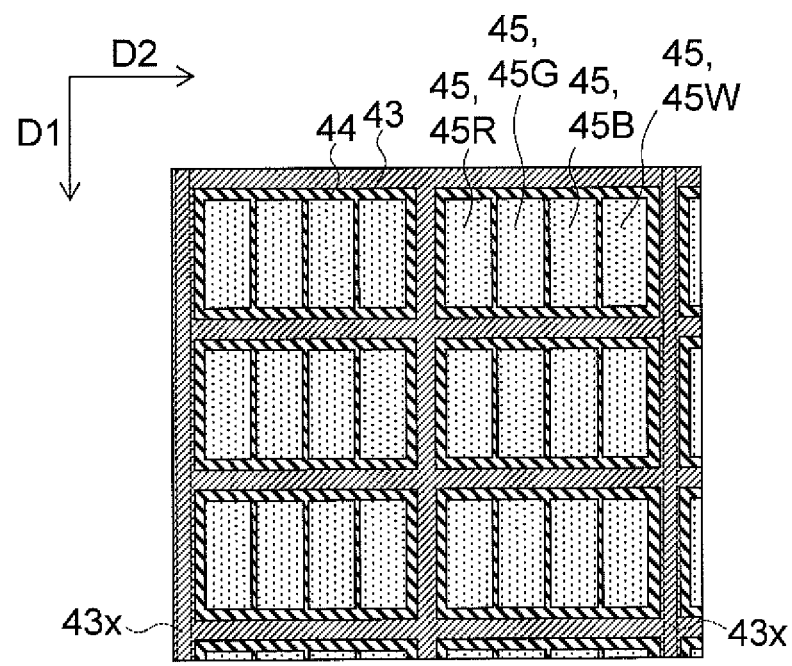
FIG. 2D is a plan view of an example of a section of the organic semiconductor layers which is to be removed on the auxiliary electrodes.

Furthermore, the layout of the auxiliary electrodes 43 is not limited as long as the voltage drop across the second electrode 46 can be appropriately reduced. For example, as shown in FIGS. 2C and 2D, the auxiliary electrodes 43 may be disposed along the pixels constituted by the organic semiconductor layers 45R, 45G, 45B, and 45W corresponding to a plurality of sub-pixels. In other words, the auxiliary electrodes 43 may be absent between the organic semiconductor layers 45R, 45G, 45B, and 45W that constitute sub-pixels, and one auxiliary electrode 43 may be formed between one of the pixels constituted by the organic semiconductor layers 45R, 45G, 45B, and 45W, and other similar pixels. Examples in which each pixel further includes the white organic semiconductor layer 45W as a sub-pixel in addition to the red organic semiconductor layer 45R, the green organic semiconductor layer 45G, and the blue organic semiconductor layer 45B are shown in FIGS. 2C and 2D.

Moreover, layout of positions in which the auxiliary electrodes 43 and the second electrode 46 are connected is not limited as long as the voltage drop across the second electrode 46 can be appropriately reduced. In FIGS. 2C and 2D, the positions where the auxiliary electrodes 43 and the second electrode 46 are connected are each shown by a dotted line denoted as reference number 43x. As shown in FIG. 2C, each auxiliary electrode 43 and the second electrode 46 may be connected discretely at a plurality of places. That is to say, the organic semiconductor layer 45 on the auxiliary electrode 43 may be removed discretely at a plurality of places. In addition, as shown in FIG. 2D, each auxiliary electrode 43 and the second electrode 46 may be connected linearly along a direction the auxiliary electrode 43 extends. That is to say, the organic semiconductor layer 45 on the auxiliary electrode 43 may be removed linearly along the direction the auxiliary electrode 43 extends. An example in which the organic semiconductor layer 45 on the auxiliary electrode 43 is removed linearly along a line denoting a direction D1 in which the lid member 21 is transported described in detail later herein is shown in FIG. 2D.

In FIGS. 2A to 2D, an example in which the plurality of kinds of organic semiconductor layers, namely 45R, 45G, 45B, and 45W, are used as organic semiconductor layers 45, is shown, which is not limited. For example, each organic semiconductor layer 45 constituting a sub-pixel may be configured to generate common white light. In this case, a color filter, for example, could be used as means for color-coding the sub-pixels.

Next, a description will be given of an element manufacturing apparatus 10 and an element manufacturing method according to the embodiment, both intended to form the organic semiconductor element 40 on the substrate 41. As long as impurities can be sufficiently prevented from entering the organic semiconductor element 40, although an environment in which the element manufacturing method is implemented is not limited, the element manufacturing method itself is implemented, for example, partially under a vacuum environment. For example, as long as the environment has a pressure lower than atmospheric pressure, although the more specific pressure in the vacuum environment is not limited, the element manufacturing apparatus 10 has an internal pressure of, for example, $1.0 \times 10^4$ Pa or less.

Element Manufacturing Apparatus

Figure 3:
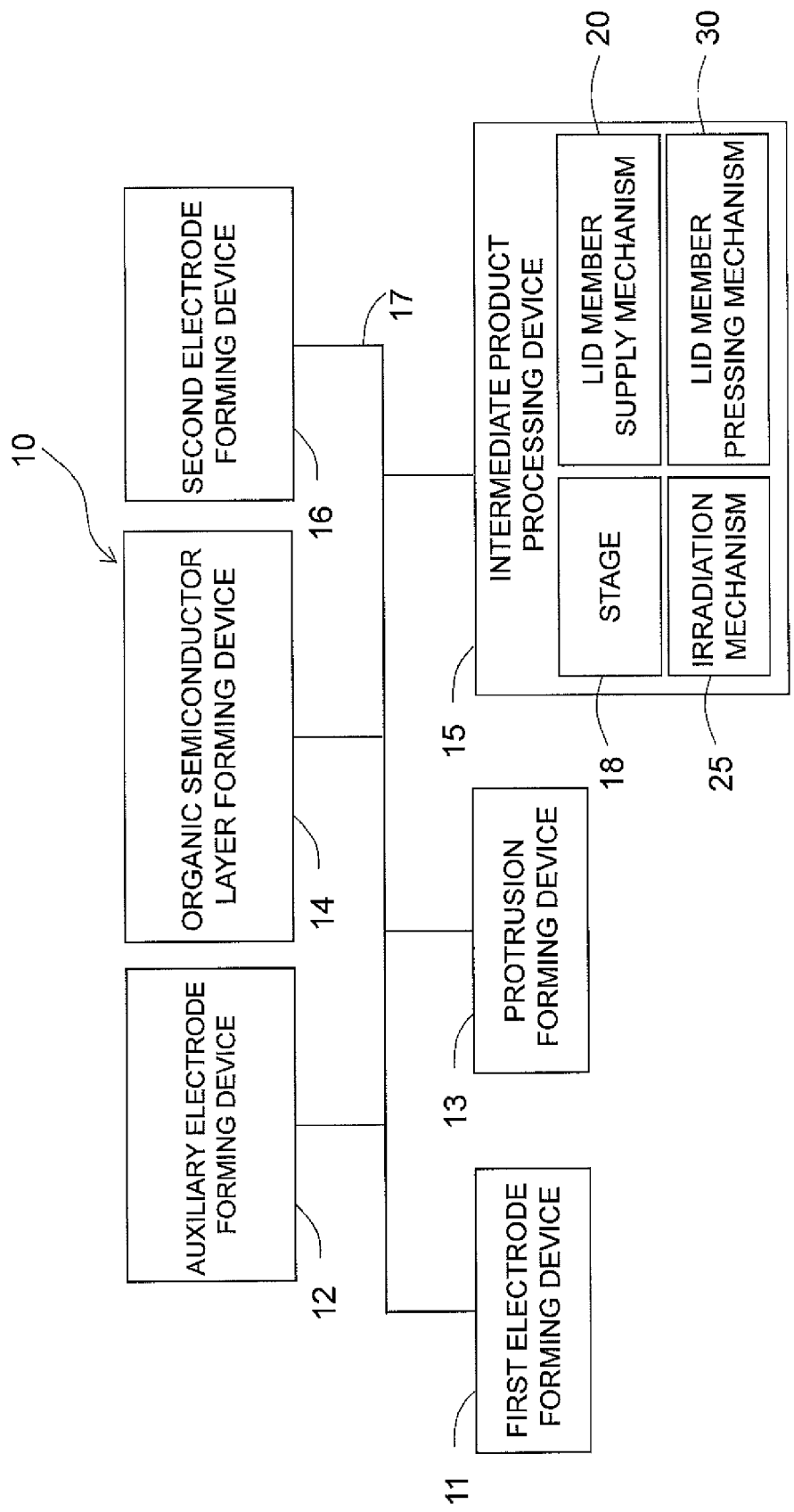
FIG. 3 is a diagram showing an element manufacturing apparatus according to the embodiment of the present invention.

FIG. 3 is a diagram showing schematically a configuration of the element manufacturing apparatus 10. As shown in FIG. 3, the element manufacturing apparatus 10 includes a first electrode forming device 11 that forms a plurality of first electrodes 42 on a substrate 41, an auxiliary electrode forming device 12 that forms an auxiliary electrode 43 between the first electrodes 42, a protrusion forming device 13 that forms a protrusion 44 between the first electrodes 42 and the auxiliary electrodes 43, and an organic semiconductor layer forming device 14 that forms an organic semiconductor layer 45 on each of the first electrodes 42, the auxiliary electrode 43, and the protrusion 44. In the following description, an object obtained in steps that use the devices 11, 12, 13, and 14 may be termed the intermediate product 50.

The element manufacturing apparatus 10 further includes an intermediate product processing device 15 that performs predetermined processing while a lid member described later herein is in close contact with part of the intermediate product 50. Here, a description will be given below of an example in which the intermediate product processing device 15 in the present embodiment is configured as a removal device for removing the organic semiconductor layer 45 disposed on the auxiliary electrode 43. The intermediate product processing device 15 includes a stage 18, a lid member supply mechanism 20, a sealing mechanism 30, and an irradiation mechanism 25. Constituent elements of the intermediate product processing device 15 will be described later herein. The lid member 21 and the element manufacturing apparatus 10 further include a second electrode forming device 16 that forms a second electrode 46 on the auxiliary electrode 43 and organic semiconductor layer 45 after the organic semiconductor layer 45 on the auxiliary electrode 43 has been removed.

The above process steps are all executed under the vacuum environment by the devices 11 to 16. As shown in FIG. 3, the element manufacturing apparatus 10 may further include a transport device 17 connected to the devices 11 to 16 in order to transport the substrate 41 and the intermediate product 50 between the devices 11 to 16 while maintaining the vacuum environment.

FIG. 3 is a diagram representing a classification of the devices as viewed from a functional perspective, and these devices do not have respective physical forms limited to the example shown in FIG. 3. For example, more than one of the devices 11 to 16 shown in FIG. 3 may be physically constituted by one device. Alternatively, any one or more of the devices 11 to 16 shown in FIG. 3 may be physically constituted by a plurality of devices. For example, as will be described later herein, at least one of the first electrodes 42 and at least one of the auxiliary electrodes 43 may be formed at the same time in one step. In this case, the first electrode forming device 11 and the auxiliary electrode forming device 12 may be configured collectively as one device.

Element Manufacturing Method

Figure 4:
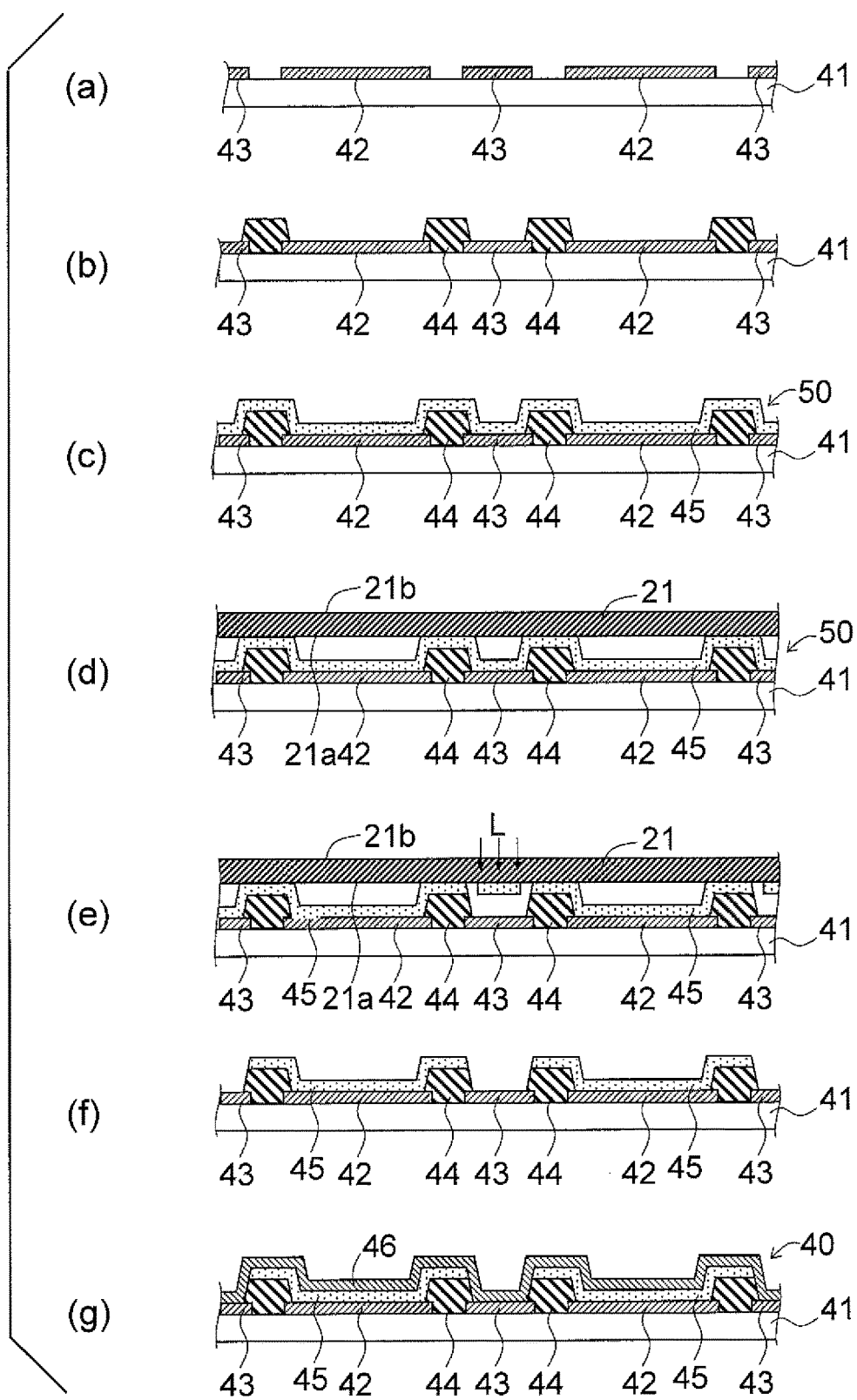
FIG. 4(a) to (g) show an element manufacturing method according to the embodiment of the present invention.

The method of manufacturing the organic semiconductor element 40 using the element manufacturing apparatus 10 will be described below with reference to FIG. 4(*a*) to (*g*). First, a layer of a metallic material which constitutes first electrodes 42 and auxiliary electrodes 43 is formed on the substrate 41 by use of a sputtering method, for example, and then the layer of the metallic material is molded by etching. Thus the first electrodes 42 and the auxiliary electrodes 43 can be formed at the same time on the substrate 41, as shown in FIG. 4(*a*). The first electrodes 42 and the auxiliary electrodes 43 may be formed in steps independent of each other.

Next as shown in section (b) of FIG. 4, a plurality of protrusions 44 each extending to a region above one of the first electrodes 42 and one of the auxiliary electrodes 43, in a normal-line direction of the substrate 41, are formed between the first electrode 42 and the auxiliary electrode 43 by means of photolithography, for example. After the formation of the protrusions 44, as shown in section (c) of FIG. 4, an organic semiconductor layer 45 is formed on the first electrodes 42, the auxiliary electrodes 43, and the protrusions 44, by use of a general film-forming method such as physical vapor deposition, chemical vapor deposition (CVD), printing, inkjet coating, or transfer. In this manner, an intermediate product 50 can be obtained that includes the substrate 41, the first electrodes 42 disposed on the substrate 41, the auxiliary electrodes 43 and protrusions 44 each disposed between the first electrodes 42, and the organic semiconductor layer 45 disposed on the first electrodes 42, the auxiliary electrodes 43, and the protrusions 44. In the present (second) embodiment, as described above, the first electrodes 42 and the auxiliary electrodes 43 are formed on the substrate 41 earlier than the protrusions 44. Accordingly the first electrodes 42 and the auxiliary electrodes 43 are partly covered with the protrusions 44.

Next, a lid member 21 is provided and then as shown in FIG. 4(*d*), the lid member 21 has its first surface 21*a* brought into close contact with part of the intermediate product 50. Next, while the lid member 21 is in close contact with the intermediate product 50, the organic semiconductor layer 45 disposed on one of the auxiliary electrodes 43 is irradiated with light L such as laser light, as shown in FIG. 4(*e*). Energy from the light L is then absorbed by the organic semiconductor layer 45 and consequently the organic semiconductor material constituting the organic semiconductor layer 45 on the auxiliary electrode 43 flies apart. In this way, the organic semiconductor layer 45 on the auxiliary electrode 43 can be removed. The organic semiconductor material that has flown apart from the auxiliary electrode 43 sticks to the first surface 21*a* of the lid member 21, as shown in FIG. 4(*e*), for example. FIG. 4(*f*) shows the state where a part of the organic semiconductor layers 45 on the auxiliary electrodes 43 has been removed.

After the organic semiconductor material has stuck to the lid member 21, as shown in FIG. 4(*g*) the second electrode 46 is formed on the organic semiconductor layers 45 positioned on the first electrodes 42, and on the auxiliary electrodes 43. In this way, the organic semiconductor element 40 with the auxiliary electrodes 43 connected to the second electrode 46 can be obtained.

Intermediate Product Processing Device

Figure 5:
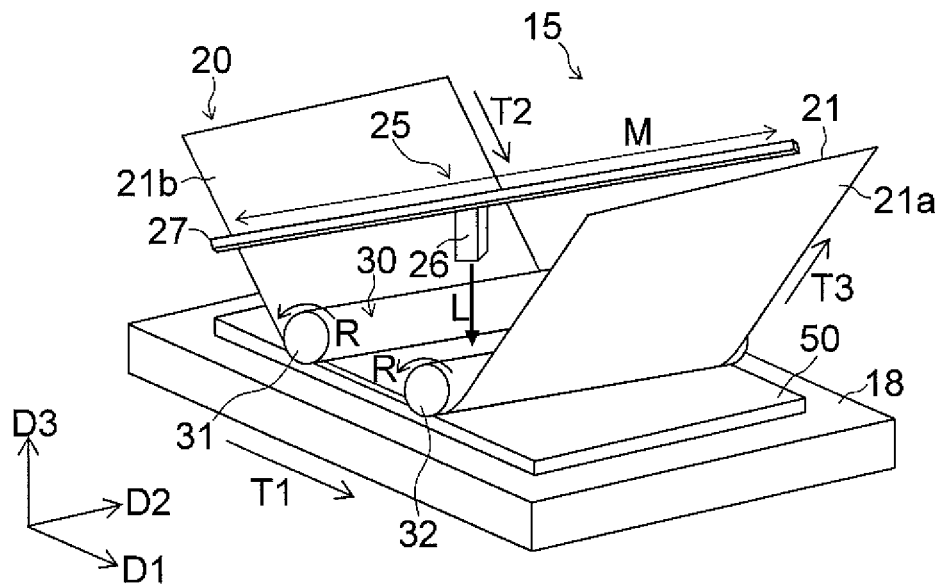
FIG. 5 is a diagram showing an intermediate product processing device used to remove the organic semiconductor layers from the auxiliary electrodes.

The method of bringing the lid member 21 into close contact with part of the intermediate product 50 and removing the organic semiconductor layer 45 on the auxiliary electrode 43 has been described with reference to FIG. 4(*d*) and FIG. 4(*e*). Further details of this method will be described below with reference to FIGS. 5 and 6. The intermediate product processing device 15 implements the steps shown in FIG. 4(*d*) and FIG. 4(*e*). First, a configuration of the intermediate product processing device 15 is described in detail below with reference to FIG. 5. In FIG. 5, a first direction, a second direction, and a third direction, which are orthogonal to each other, are denoted as arrows D1, D2, and D3, respectively.

As shown in FIG. 5, the intermediate product processing device 15 includes a stage 18 on which the intermediate product 50 is mounted, a lid member supply mechanism 20 that supplies the lid member 21 of a long-size shape, a sealing mechanism 30 that brings part of the lid member 21 into close contact with part of the intermediate product 50, and an irradiation mechanism 25 that irradiates with light a section of the intermediate product 50 that the lid member 21 is kept in close contact with. Elements of the intermediate product processing device 15 are arranged in a chamber maintained in a vacuum atmosphere. Accordingly the step of removing the organic semiconductor layer 45 on the auxiliary electrode 43 can be carried out under the vacuum atmosphere. The following describes the elements of the intermediate product processing device 15. The "long-size shape" means that a dimension of the lid member 21 in the direction that it is transported is at least five times a dimension of the lid member 21 in the direction orthogonal to that in which it is transported.

Stage

The stage 18 has a mounting surface 18a for supporting the intermediate product 50, and the mounting surface 18a has an expanse that is parallel to the first direction D1 and the second direction D2. In addition, the stage 18 is configured to be movable in a moving direction T1 of the stage that is parallel to the first direction D1. The intermediate product 50 is mounted on the stage 18 so that the plurality of protrusions 44 line up on the substrate 41, in the first direction D1. Accordingly, as will be described later herein, either the protrusions 44 of the intermediate product 50 that are lined up in the first direction D1, or peripheral sections of the protrusions 44 can be sequentially irradiated with light by repeating the movement of the stage 18 in the moving direction T1 thereof and the irradiation of the intermediate product 50 with light from the irradiation mechanism 25. The protrusions 44 of the intermediate product 50 mounted on the stage 18 extend in the third direction D3 that is orthogonal to the first direction D1 and the second direction D2.

Lid Member Supply Mechanism and the Sealing Mechanism 30

As shown in FIG. 5, the sealing mechanism 30 includes one pair of rollers, 31 and 32, that rotate in a rotational direction R around a rotational axis extending in the second direction D2 orthogonal to the first direction D1. The paired rollers 31 and 32 consist of a first roller 31 and a second roller 32. The lid member supply mechanism 20 includes a feeder that feeds the lid member 21 in a feed direction T2, between the first roller 31 and the intermediate product 50, and a take-up section that takes up the lid member 21 in a take-up direction T3 after the lid member 21 has moved past between the second roller 32 and the intermediate product 50. The feeder and the take-up section are not shown. In the present embodiment with these mechanisms, the lid member 21 for covering a part of the intermediate product 50 is supplied on a roll-to-roll basis. In the following description, of all surfaces of the lid member 21, a surface oriented toward the stage 18 is termed the first surface 21a, and a surface opposite to the first surface 21a is termed the second surface 21b. The rollers 31 and 32 both abut the second surface 21b of the lid member 21.

At least one of polyethylene terephthalate (PET), cycloolefin polymer (COP), polypropylene (PP), polyethylene (PE), polycarbonate (PC), a glass film, and other materials having a property to transmit light is used as a material for the lid member 21 to allow light such as laser light to pass through.

The rollers 31 and 32 of the sealing mechanism 30 are constructed to rotate in synchronization with the movement of the stage 18. In other words, the rollers 31 and 32 transport the lid member 21 has been wound around the rollers 31 and 32 at a speed matching to that at which the stage 18 moves. The rollers 31 and 32 are also configured to apply predetermined tension to the lid member 21 positioned between the rollers 31 and 32, as well as to transport the lid member 21. Accordingly it can be described that a section of the lid member 21 that is positioned between the rollers 31 and 32 is tensioned between and by the paired rollers 31, 32. In the following description, the section of the lid member 21 that is tensioned between and by the paired rollers 31, 32 will also be termed the tensioned section 21c. Although this is not shown, the paired rollers 31, 32 each include a drive for rotating the roller 31 or 32 while supporting it at a predetermined position.

A more specific configuration of the drives for rotating the rollers 31, 32 is not limited as long as an optical path for emitting light toward the intermediate product 50 is not obstructed.

Irradiation Mechanism

As shown in FIG. 5, the irradiation mechanism 25 includes an optical head 26 that emits the light L such as laser light. The light that has been emitted from the optical head 26 passes through the tensioned section 21c of the lid member 21 and reaches the intermediate product 50. The irradiation mechanism 25 may further include a lens for focusing the light L upon the organic semiconductor layer 45.

The optical head 26 is fixed with respect to the movement of the stage 18 and the rotation of the rollers 31. That is to say, the optical head 26 is disposed independently of the stage 18 and the rollers 31. For example, the optical head 26 is configured so that the traveling direction of the light L generated by the optical head 26 will remain unchanged even after the stage 18 has moved or the rollers 31 have rotated. Meanwhile, as described above, the stage 18 can be moved in the first direction D1 and the protrusions 44 of the intermediate product 50 are lined up in the first direction D1. Even when the optical head 26 is at rest, therefore, the protrusions 44 or the peripheral sections of the protrusions 44 can be sequentially irradiated with the light. In addition, because of no need to move the optical head 26 in the first direction D1, no misalignment of an aiming line of the optical head 26 occurs during necessary steps. Therefore, this means that light irradiation can be executed with high positional accuracy relative to irradiating a plurality of sections of the intermediate product 50 with light while moving the optical head 26.

As indicated by an arrow M in FIG. 5, the optical head 26 may be configured to be movable in the second direction D2, that is, along the rotational axes of the rollers 31 and 32. This allows any section of the intermediate product 50 to be irradiated with the light, as will be described later. A more specific configuration for moving the optical head 26 is not limited. For example, the optical head 26 can move along a rail 27 disposed above the stage 18. In addition, when the optical head 26 is configured to be able to selectively extract light at a given position in the second direction even under a stationary state of the optical head 26, the intermediate product 50 can be irradiated with the light at that given position in the second direction. A method useable to selectively extract the light at the given position in the second direction, although this is not shown, would be by placing a mask formed with a plurality of openings, between the irradiation mechanism 25 and the lid member 21, and selectively shielding the openings 28a.

In the case where the intermediate product 50 can be irradiated with the light at that given position in the second direction, sections of the intermediate product 50 that are to be irradiated with the light do not need to line up in the first direction orthogonal to the second direction. Therefore, although this is not shown, the protrusions 44 of the intermediate product 50 do not need to line up in the first direction D1.

Figure 6:
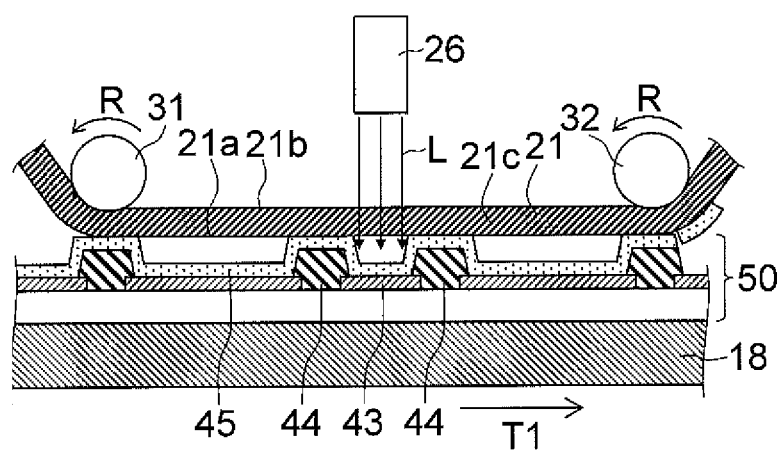
FIG. 6 is a diagram showing the way the organic semiconductor layer on an auxiliary electrode is removed by using the intermediate product processing device shown in FIG. 5.

Next, a method of removing the organic semiconductor layer 45 on an auxiliary electrode 43 using the intermediate product processing device 15 will be described with reference to FIG. 6.

First the lid member 21 having the first surface 21a is set in place so that the first surface 21a faces the protrusions 44 of the intermediate product 50. A lid member supply step is executed to supply the lid member 21 between the first roller 31 and the intermediate product 50 by use of, for example, the lid member supply mechanism 20 so that the first surface 21a orients toward the stage 18. Next, a sealing step is executed to press a part of the first surface 21a of the lid member 21 against the intermediate product 50 by use of the paired rollers 31, 32 of the sealing mechanism 30. Thus, part of the first surface 21a of the lid member 21 comes into firm contact with a part of the intermediate product 50. More specifically, as shown in FIG. 6, the first surface 21a of the tensioned section 21c of the lid member 21 comes into close contact with a part of the intermediate product 50. At this time, as described above, predetermined tension is applied to the tensioned section 21c of the lid member 21 that is being tensioned between the paired rollers 31, 32. In addition, sections of the lid member 21 that abut the paired rollers 31, 32 are each being pressed toward the intermediate product 50, as shown in FIG. 6. Accordingly, not only the sections of the lid member 21 that abut the paired rollers 31, 32, but also the tensioned section 21c between the paired rollers 31, 32 is being pressed at a predetermined pressure against the intermediate product 50. For example, in the example of FIG. 6, the tensioned section 21c is being pressed at the predetermined pressure against the section of the intermediate product 50 that includes the protrusions 44. Therefore this allows the first surface 21a of the lid member 21 to be pressed firmly, without a clearance, against the section of the intermediate product 50 that is provided with the protrusions 44.

The sealing step is followed by an irradiation step, in which step the section of the intermediate product 50 that is in close contact with the lid member 21 is irradiated with light via the lid member 21. The expression of the "section of the intermediate product 50 that is in close contact with the lid member 21" means a concept encompassing not only the protrusions 44 themselves that are in direct contact with the first surface 21a of the lid member 21, but also sections surrounded by the protrusions 44 that are in direct contact with the first surface 21a of the lid member 21. Not all of the section of the intermediate product 50 that is in close contact with the lid member 21 requires light irradiation. In the present embodiment, the section of the intermediate product 50 that is in close contact with the lid member 21 and includes the organic semiconductor layer 45 to be removed is irradiated with the light. FIG. 6 shows the way the light L that has been emitted from the optical head 26 of the irradiation mechanism 25 passes through the tensioned section 21c of the lid member 21 and reaches the organic semiconductor layer 45 disposed on an auxiliary electrode 43 of the intermediate product 50. As the organic semiconductor layer 45 absorbs energy of the light L, the organic semiconductor material constituting the organic semiconductor layer 45 disposed on the auxiliary electrode 43 will fly apart as described above.

Here, in accordance with the present embodiment, as described above, the tensioned section 21c, which is being tensioned tautly at the predetermined pressure, is formed on the lid member 21 and then pressed at the predetermined pressure against part of the intermediate product 50. For this reason, the first surface 21a of the tensioned section 21c of the lid member 21 can be brought into firm contact, without a clearance, with the section of the intermediate product 50 that includes the protrusions 44. Thus the organic semiconductor material that has flown apart from the surface of the auxiliary electrode 43 can be more reliably prevented from contaminating the organic semiconductor layer 45 on the first electrode 42, and an ambient environment.

In this manner, a simplified constituent element of the paired rollers 31, 32 can be used to cover part of the intermediate product 50 efficiently with the lid member 21. For this reason, the organic semiconductor element 40 having high quality can be manufactured at a low cost.

Once the organic semiconductor layer 45 on the auxiliary electrode 43 has been removed, the light from the irradiation mechanism 25 is shut down. That is to say, the irradiation of the intermediate product 50 with the light is stopped.

Next, the stage 18 is moved in the moving direction T1 of the stage and the lid member 21 is moved in the rotational direction R of the rollers 31, 32. After this, when the next organic semiconductor layer 45 to be removed from the auxiliary electrode 43 reaches the optical path of the light L that extends from the optical head 26 to the intermediate product 50, the irradiation mechanism 25 emits the light once again. The organic semiconductor layer 45 on that auxiliary electrode 43 is then irradiated with the light L from the irradiation mechanism 25, whereby the organic semiconductor layer 45 is removed. In this manner, the organic semiconductor layers 45 on the auxiliary electrodes 43 lined up in the first direction D1 parallel to the moving direction T1 of the stage can be removed in order. The organic semiconductor layers 45 on the auxiliary electrodes 43 are usually arranged at equal intervals above the substrate 41. The organic semiconductor layers 45 on the auxiliary electrodes 43 may therefore be irradiated with the light in order by turning on and off the light irradiation from the irradiation mechanism 25 at fixed periods allowing for particular intervals of the auxiliary electrodes 43 and the moving speed of the stage 18.

As can be seen from the above, when the stage 18 moves and the paired rollers 31, 32 rotate, the optical head 26 of the irradiation mechanism 25 remains at rest. In the present embodiment, therefore, the intermediate product 50 can be light-irradiated with high positional accuracy, which in turn allows accurate removal of the organic semiconductor layer 45 from the surface of the auxiliary electrode 43.

In addition, in accordance with the present embodiment, the lid member 21 supplied on a roll-to-roll basis can be used to cover the intermediate product 50 placed on the moving stage 18. Accordingly the step of removing the organic semiconductor layer 45 on the auxiliary electrode 43 can be executed for a plurality of intermediate products 50 by use of one roll unit having one lid member 21 wound around it. Hence, a device or step for cutting the lid member 21 for each intermediate product 50 is unnecessary, for which reason the apparatus configuration and the steps can be simplified. Occurrence of gas due to the cutting of the lid member 21, and resulting contamination of the intermediate product 50 can also be prevented.

After the above removal, the optical head 26 may be moved along the rail 27 to remove any one of the organic semiconductor layers 45 on the auxiliary electrodes 43 positioned on a line different from that of the first direction D1 in which the organic semiconductor layer 45 removed in the above step has existed. After the optical head 26 has been moved, another one of the organic semiconductor layers 45 on the auxiliary electrodes 43 positioned on the new line can be removed by executing the above step once again while moving the stage 18.

Various changes may be made to the embodiments described above. Modifications will be described with reference being made to part of the accompanying drawings. In the following description and the drawings used therein, the same reference numbers as those which have been used to denote the corresponding elements/sections in the above embodiments will be used for the elements/sections that can be configured similarly to those of the embodiments, and overlapped description will be omitted. In addition, where the operational effects obtained in the embodiments can also be obviously obtained in the modifications, description of these effects may be omitted.

A modification of the Layer Configuration in the Organic Semiconductor Element

The examples where the first electrodes 42 and the auxiliary electrodes 43 are formed on the substrate 41 earlier than the protrusions 44 have been shown and described in the embodiments described above. These examples, however, are not restrictive and in a modification, the protrusions 44 may be formed on the substrate 41 earlier than the first electrodes 42 and the auxiliary electrodes 43. The close-fitting step and removal step in any one of the embodiments described above can be used even in such a modification as well. This modification will be described below with reference to FIG. 7(a) to (g).

Figure 7:
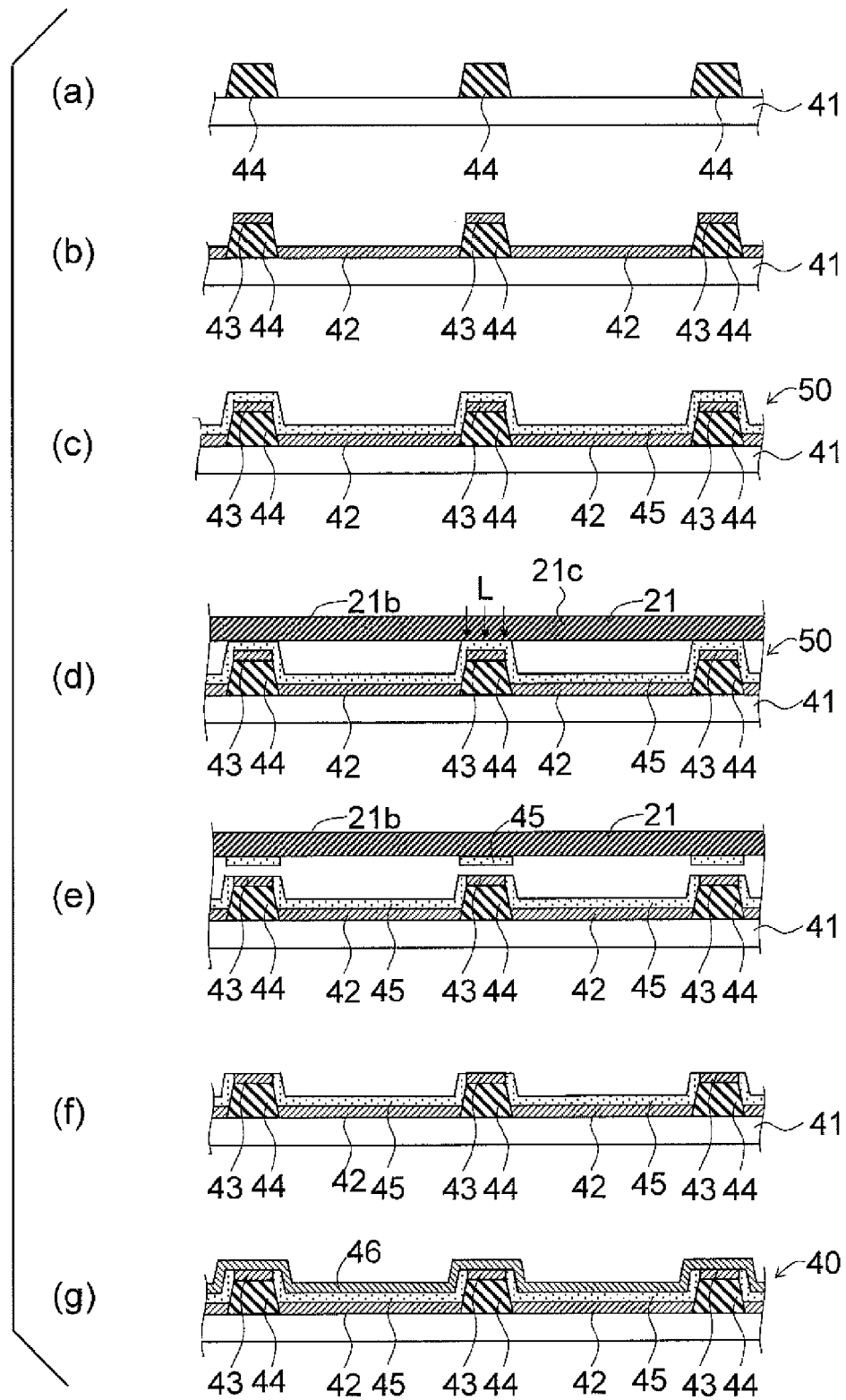
FIG. 7(a) to (g) show the step of removing an organic semiconductor layer from auxiliary electrode in a modification of the embodiment of the present invention.

First as shown in FIG. 7(a), a plurality of protrusions 44 are formed on a substrate 41. Next as shown in FIG. 7(b), a first electrode 42 is formed between every two of the protrusions 44. In addition, an auxiliary electrode 43 is formed on each of the protrusions 44. In this way, a plurality of first electrodes 42 electrically insulated from each other by the protrusions 44, and auxiliary electrodes 43 disposed on the protrusions 44 can be obtained. Instead, although this is not shown, first electrodes 42 may be formed on the substrate 41 first, next a protrusion 44 may be formed between every two of the first electrodes 42, and then an auxiliary electrode 43 may be formed on each of the protrusions 44.

After the formation of the electrodes 42 and 43, as shown in FIG. 7(c), an organic semiconductor layer 45 is formed on the first electrodes 42, the auxiliary electrodes 43, and the protrusions 44. In this way, an intermediate product 50 can be obtained that includes the substrate 41, the first electrodes 42 disposed on the substrate 41, the auxiliary electrodes 43 and protrusions 44 disposed between the first electrodes 42, and the organic semiconductor layer 45 disposed on the first electrodes 42 and the auxiliary electrodes 43. In the present modification, the protrusions 44 are formed earlier than the auxiliary electrodes 43, and thus the protrusions 44 are covered with the auxiliary electrodes 43. The protrusions 44 do not need to have their upper surfaces covered with the auxiliary electrodes 43 over respective entire regions. In other words, the upper surfaces of the protrusions 44 need only to be at least partly covered with the auxiliary electrodes 43. In addition, an example of disposing the protrusions 44 in two rows between the first electrodes 42 and disposing the auxiliary electrode 43 between every two of the protrusions 44 has been shown and described in the above embodiments, but in the present modification, since one auxiliary electrode 43 is disposed on each of the protrusions 44, the protrusions 44 may only be disposed in one row between the first electrodes 42, as shown in FIG. 7(c).

Next as shown in section FIG. 7(d), the lid member close-fitting step is executed to press the tensioned section 21c of the lid member 21 toward part of the intermediate product 50 by use of the paired rollers 31, 32 of the sealing mechanism 30 and thus bring part of the first surface 21a of the lid member 21 into firm contact with the part of the intermediate product 50. In FIG. 7(d) and FIG. 7(e) that will be described later, the stage 18 for mounting the intermediate product 50 is omitted.

In the present modification as well, as in the above embodiments, the sections of the lid member 21 that abut the paired rollers 31, 32 are each being pressed toward the intermediate product 50. Accordingly, not only the sections of the lid member 21 that abut the paired rollers 31, 32, but also the tensioned section 21c between the paired rollers 31, 32 is being pressed at the predetermined pressure against the section of the intermediate product 50 that is provided with the protrusions 44. Therefore this method allows the first surface 21a of the lid member 21 to be pressed firmly, without a clearance, against the section of the intermediate product 50 that is provided with the protrusions 44.

After the above pressing operation, the organic semiconductor layer 45 on the auxiliary electrode 43 positioned on a protrusion 44 is irradiated with the light L, whereby as shown in FIG. 7(e), the organic semiconductor layer 45 on the auxiliary electrode 43 becomes stuck to the lid member 21. FIG. 7(f) shows a state in which the organic semiconductor layer 45 on the auxiliary electrode 43 positioned on the protrusion 44 has been removed. In the present modification, the lid member 21 comes into close contact with the organic semiconductor layer 45 to be removed. In this case, the organic semiconductor layer 45 on the auxiliary electrode 43 positioned on the protrusion 44 can be transferred to the first surface 21a of the lid member 21 without performing the irradiation with the light L, by setting appropriate surface energy of the first surface 21a. That is to say, bringing the tensioned section 21c of the lid member 21 into close contact with a part of the intermediate product 50 allows the organic semiconductor layer 45 on the auxiliary electrode 43 to be removed.

After the above removal, as shown in FIG. 7(g), a second electrode 46 is formed on the organic semiconductor layers 45 positioned on the first electrodes 42, and on the auxiliary electrodes 43 positioned on the protrusions 44. In this manner, the organic semiconductor element 40 with the auxiliary electrodes 43 connected to the second electrode 46 can be obtained.

A Modification in Which the Intermediate Product Processing Device is Configured as an Exposure Device The examples where the intermediate product processing device 15 is configured as the removal device to remove part of the organic semiconductor layers 45 on the auxiliary electrodes 43 have been shown and described in the above embodiments and in a modification. Applications of the intermediate product processing device 15, however, are not limited to the examples. For example, although this is not shown, the intermediate product processing device 15 may be used as an exposure device that executes an exposure step in which it irradiates a desired layer of the intermediate product 50 with exposure light L while the lid member 21 is in close contact with the intermediate product 50.

Figure 8:
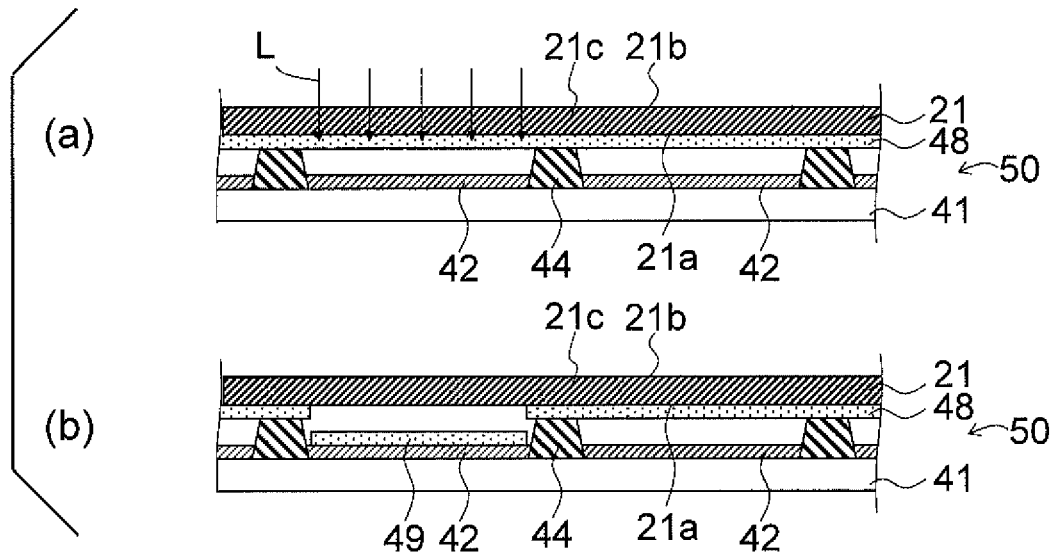
FIG. 8(a) and FIG. 8(b) show an example in which the intermediate product processing device is used to vapor-deposit a vapor-deposition material on a substrate.

A Modification in Which the Intermediate Product Processing Device is Configured as a Vapor Deposition Device In an alternative modification, as shown in FIG. 8(a) and FIG. 8(b), the intermediate product processing device 15 may be used as a vapor deposition device that vapor-deposits a vapor deposition material 48 on the substrate 41 by irradiating the material 48 with light while the lid member 21 is in close contact with the intermediate product 50.

In the present modification, as shown in FIG. 8(a), the vapor deposition material 48 is disposed on the first surface 21a of the lid member 21. In addition, as shown in FIG. 8(a), the intermediate product 50 includes the substrate 41, the plurality of protrusions 44 disposed on the substrate 41, and the first electrodes 42 each disposed between any two of the protrusions 44. In this case, the vapor deposition material 48 will evaporate when it is irradiated with the light L such as infrared rays by use of the intermediate product processing device 15. More specifically as shown in FIG. 8(a), when a region of the vapor deposition material 48 that is present at a position facing one of the first electrodes 42 is irradiated with the light L, the vapor deposition material 48 will evaporate and stick to that first electrode 42 on the substrate 41. As a result, a vapor-deposited layer 49 can be formed on the corresponding first electrode 42, as shown in FIG. 8(b). Additionally a space between the substrate 41 and the lid member 21 is appropriately partitioned by the protrusions 44. This prevents the vapor deposition material 48 from flying apart over a wide region in the space between the substrate 41 and the lid member 21.

The evaporation of the vapor deposition material 48 by heating is not limited to the method described above. For example, the vapor deposition material 48 may be heated by forming an infrared-light absorbing metallic thin film between the first surface 21a of the lid member 21 and the organic semiconductor layer 45 and emitting light toward the metallic thin film for heating. In this case, although substantially no light is directly applied to the vapor deposition material 48 on the first surface 21a of the lid member 21, the vapor deposition material 48 can be evaporated since it can be heated indirectly via the metallic thin film. Whether the vapor deposition material 48 is directly irradiated with the light or heated indirectly via the metallic thin film, it is common in that the light is emitted toward a section of the lid member 21 that is formed with a curved shape.

If the metallic thin film is formed from a magnetic material, for tighter contact between the lid member 21 and the intermediate product 50, magnetic fields may be generated around the lid member 21 or a magnetic body may be placed at an opposite side of the intermediate product 50 with respect to the lid member 21, thereby to generate a magnetic force that draws the lid member 21 toward the intermediate product 50.

A Modification of the Stage

Figure 9:
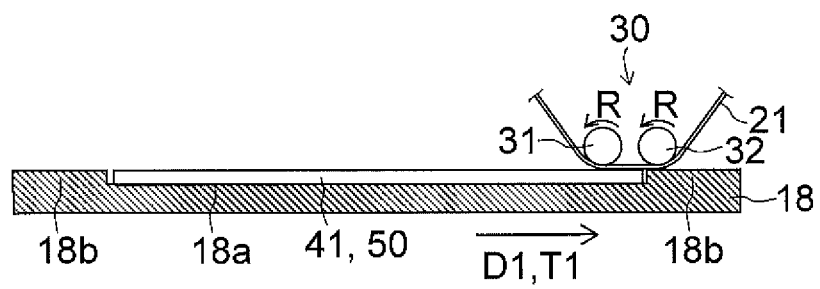
FIG. 9 is a diagram showing a modification of a stage of the intermediate product processing device.

On the stage 18 for mounting the intermediate product 50, a region 18b protruded in the normal-line direction of the substrate 41 may, as shown in FIG. 9, be formed adjacently to an edge of the substrate 41 of the intermediate product 50, in the first direction D1. The protruded region 18b is constructed so that a position of its upper surface virtually agrees with that of an upper surface of the intermediate product 50. In this case, the lid member 21 can be tensioned while one of the paired rollers 31, 32, for example the first roller 31 is positioned above the intermediate product 50 via the lid member 21 and the other roller, for example the second roller 32 is positioned above the protruded region 18b of the stage 18 via the lid member 21. Accordingly, the tensioned section 21c of the lid member 21 can be positioned close to the edge of the substrate 41 of the intermediate product 50. This enables the tensioned section 21c of the lid member 21 to be pressed firmly against a section of the intermediate product 50 that lies close to the edge of the substrate 41. Processing that uses the intermediate product processing device 15 can therefore be carried out upon an entire region of the intermediate product 50.

A modification of the Lid Member

Figure 10:
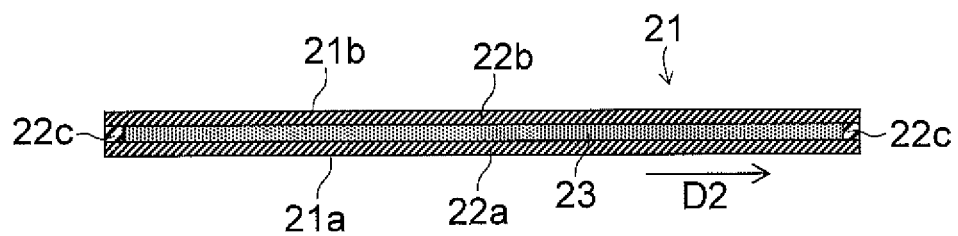
FIG. 10 is a diagram showing a modification of a lid member.

The examples where the lid member 21 is formed from a single layer of a material having a nature to transmit light have been shown and described in the above embodiments and modifications. The lid member 21 may however be formed from a plurality of layers. For example as shown in FIG. 10, the lid member 21 may contain a first film 22a and a second film 22b. The first film 22a constitutes the first surface 21a of the lid member 21 that faces in the direction of the stage 18, and the second film 22b constitutes the second surface 21b lying at the opposite side with respect to the first surface 21a. FIG. 10 is a sectional view of the lid member 21 as cut in the second direction D2, that is, along the rotational axes of the rollers 31, 32.

As shown in FIG. 10, a sealing member 22c may intervene between the first film 22a and the second film 22b. In an example of FIG. 10, the sealing member 22c extending longitudinally along the film 22a or 22b is disposed near an end portion of each of the films 22a and 22b, in the second direction D2. Disposing the sealing members 22c enables a gap to be provided between the first film 22a and the second film 22b, and a space 23 between the first film 22a and the second film 22b to be sealed from the outside. For example, the space between the first film 22a and the second film 22b may be sealed with a gaseous substance such as air or nitrogen gas. Advantages obtainable from using the lid member 21 whose internal space 23 has been sealed with such a gaseous substance will be described below with reference to FIG. 11.

Figure 11:
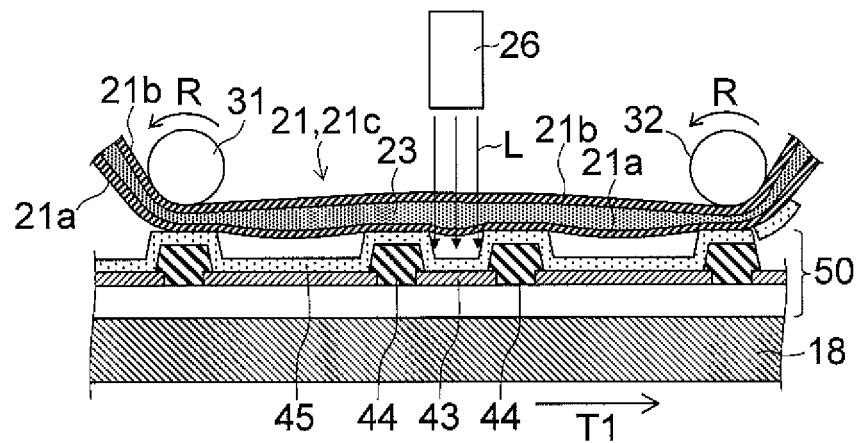
FIG. 11 is a diagram showing the way an intermediate product is covered by the lid member shown in FIG. 10.

A case in which the sealing step for bringing the first surface 21a of the lid member 21 into close contact with a part of the intermediate product 50 is executed under a reduced-pressure environment having a pressure lower than atmospheric pressure, such as a vacuum environment, is considered here. In this case, when the space between the first film 22a and the second film 22b is charged with the gaseous substance, this substance expands according to a particular difference between its pressure and the pressure under the reduced-pressure environment. This expansion makes an attempt to widen the gap between the first film 22a and the second film 22b. In other words, the films 22a and 22b each attempt expanding outward. By contrast, at the sections of the lid member 21 that abut the rollers 31 and 32, the gap between the first film 22a and the second film 22b always remains constant on the basis of a gap between the rollers 31, 32. In this case, as shown in FIG. 11, at the section of the lid member 21 that lies between the paired rollers 31 and 32, that is, at the tensioned section 21c, the first film 22a expands toward the space in the intermediate product 50 where the protrusions 44 are absent. This means that the first film 22a is brought into stronger and closer contact with the section of the intermediate product 50 that includes the protrusions 44, than in a case of no such expansion occurring. Accordingly in accordance with the present modification, the first surface 21a of the lid member that is formed from the first film 22a can be pressed more firmly, without a clearance, against the section of the intermediate product 50 that includes the protrusions 44. Thus the organic semiconductor material that has flown apart from the surface of an auxiliary electrode 43 can be more reliably prevented from contaminating the organic semiconductor layer 45 on the first electrode 42, and the ambient environment.

A more specific configuration of the lid member 21 is not limited as long as the space 23 between the first film 22a and the second film 22b can be charged with the gaseous substance. For example, a hollow resin with a multitude of hollow portions may be disposed between the first film 22a and the second film 22b. In the hollow portions of the hollow resin, the gaseous substance such as air is present, so that when the lid member 21 having the hollow resin is placed under the vacuum environment, the gaseous substance in the hollow portions of the hollow resin will expand, which will result in the films 22a and 22b each expanding outward. Disposing the hollow resin will also enable the gap between the first film 22a and the second film 22b to be stably maintained. The hollow resin can be a resin containing hollow particles formed from, for example, styrene, acryl, or silica, or a resin containing such a hollow structure as found in porous silica.

A Modification of the Sealing Mechanism

The examples where the second surface 21b of the lid member 21 comes into direct contact with the paired rollers 31 and 32 for tensioning the lid member 21 have been shown and described in the above embodiments and modifications. A more specific configuration of the sealing mechanism 30, however, is not limited as long as tension can be applied to the section of the lid member 21 that covers the intermediate product 50.

Figure 12:
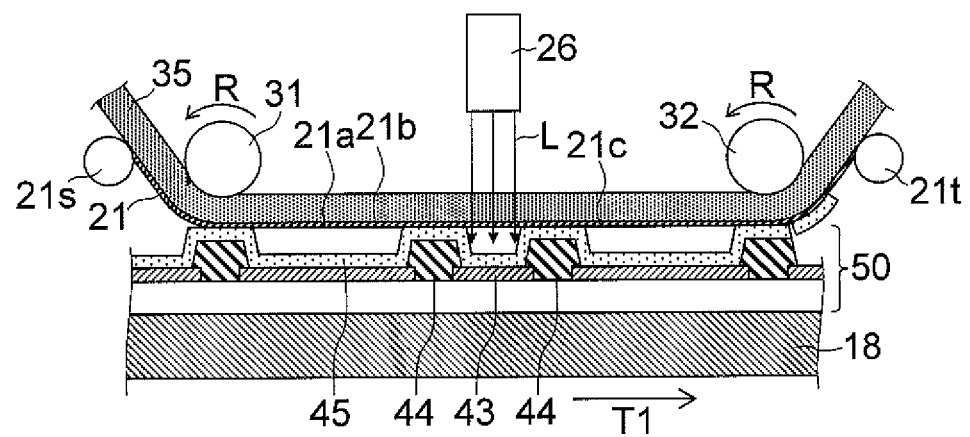
FIG. 12 is a diagram showing an example in which a sealing mechanism includes an intermediate film.

For example as shown in FIG. 12, the sealing mechanism 30 may include an intermediate film disposed between the paired rollers 31, 32 and the lid member 21. In the example of FIG. 12, after the intermediate film of a long-size shape that has been unwound from an unwinder not shown, the intermediate film is transported by the paired roller 31, 21 and then taken up by a take-up section not shown. The paired rollers 31, 32 press the lid member 21 in the direction of the intermediate product 50 via the intermediate film 35. In the present modification as well, as in the above embodiments, the tensioned section 21c of the lid member 21 that lies between the paired rollers 31, 32 is pressed at a predetermined pressure against the intermediate product 50 via the intermediate film 35. The first surface 21a of the lid member 21 can therefore be brought into close contact, without a clearance, with the section of the intermediate product 50 that is provided with the protrusions 44.

In addition, in accordance with the present modification, the pressing force or tension that the lid member 21 receives is not applied directly from the paired rollers 31, 32 to the lid member 21, instead, the pressing force or the tension is applied to the lid member 21 via the intermediate film 35. The intermediate film 35 here is in contact with the lid member 21, over a wide region at the section positioned between the paired rollers 31, 32. The contact enables suppression of wrinkling and other deformation of the lid member 21 due to the pressing force or tension that the lid member 21 receives. This in turn renders it less likely for such wrinkling and other deformation of the lid member 21 to lead to occurrence of gaps between the lid member 21 and the protrusions 44. In the present modification, the lid member 21 that has been unwound from the unwinder 21s covers the intermediate product 50 while being overlaid upon the intermediate film 35, then becomes separated from the intermediate film 35, and is taken up by the take-up section 21t.

The material constituting the intermediate film 35, and thickness, a layer configuration, and other factors of the intermediate film 35 are selected so that the pressing force or tension can be appropriately applied to the lid member 21 via the intermediate film 35. For example, a material having a coefficient of elasticity that is higher than that of the material constituting the lid member 21 is used as the material constituting the intermediate film 35. In addition, the thickness of the intermediate film 35 may be increased above that of the lid member 21 to curve or bend the intermediate film 35 for protrusion toward the intermediate product 50, between the paired rollers 31, 32, and thereby to strongly press the lid member 21 against the intermediate product 50. Furthermore, the intermediate film 35 may be formed by stacking a plurality of films. For example, the intermediate film 35 may include one pair of films and an interference film disposed between the paired films. The paired films can be, for example, one pair of PET films each ranging from 100 to 500 μm in thickness. The interference layer may be formed using a light-transmissive material of a gel form. A light-transmissive optical pressure-sensitive adhesive, so-called an optical clear adhesive (OCA), can be used as the material for the interference layer.

In the present modification, the organic semiconductor material that has flown apart from an auxiliary electrode 43 of the intermediate product 50 sticks to the first surface 21a of the lid member 21. To manufacture the organic semiconductor element 40 having high quality, therefore, it is preferable that the lid member 21 with the organic semiconductor material sticking thereto be discarded without being reused during the manufacture of the organic semiconductor element 40. The organic semiconductor material, however, does not stick to the intermediate film 35. In addition, as shown in FIG. 12, the lid member 21 and the intermediate film are separated from each other and then recovered separately. The intermediate film 35 can therefore be reused during the manufacture of the organic semiconductor element 40 that follows the recovery of the intermediate film 35.

Other Modifications of the Sealing Mechanism

The examples in which the paired rollers 31, 32 are used as one pair of tensioning members to apply tension to the lid member 21 have been shown and described in the above embodiments and modifications. A more specific configuration of the paired tensioning members, however, is not limited as long as the section of the lid member 21 that covers the intermediate product 50 can be tensioned.

Figure 13:
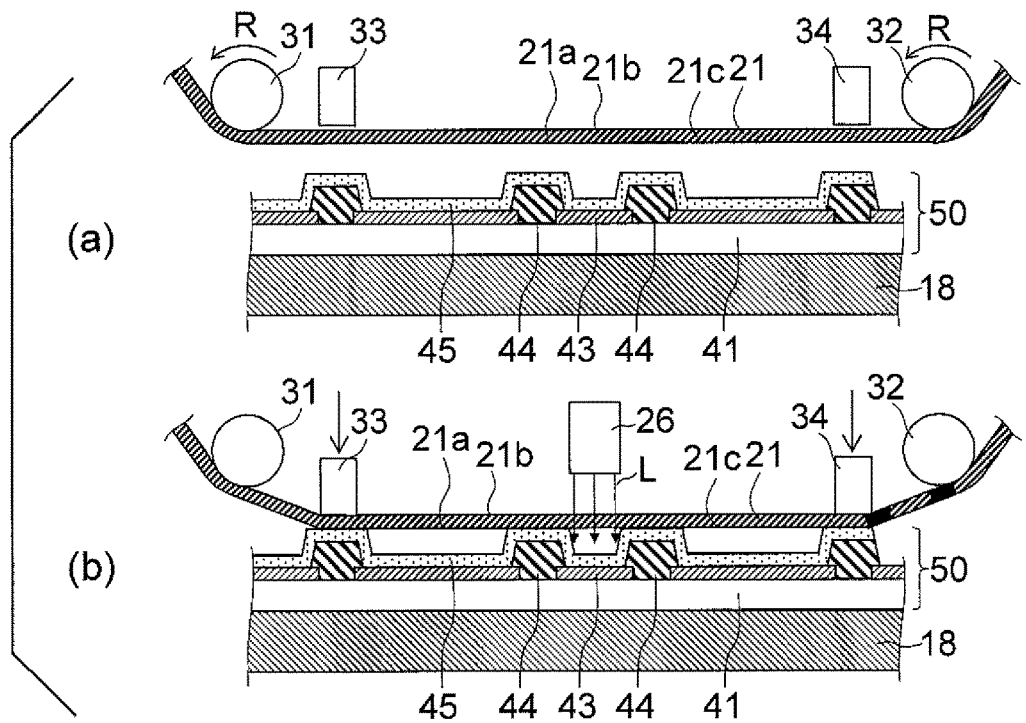
FIG. 13(a) and FIG. 13(b) show an example in which the lid member is tensioned by one pair of tensioning members movable toward the intermediate product.

For example, as shown in FIG. 13(a) and FIG. 13(b), the paired tensioning members 33 and 34 of the sealing mechanism 30 may be configured to be movable toward the intermediate product 50 so that the tensioning members press the lid member 21 in the direction of the intermediate product 50. In this case, as shown in FIG. 13(a), when the tensioning members 33, 34 are out of contact with the second surface 21b of the lid member 21, the lid member 21 is transported by the paired rollers 31, 32. Next as shown in FIG. 13(b), after the paired rollers 31, 32 have been stopped, the paired tensioning members 33, 34 are moved toward the intermediate product 50 and then brought into contact with the second surface 21b of the lid member 21. Thus the lid member 21 is tensioned between the paired tensioning members 33, 34. That is to say, the section of the lid member 21 that is positioned between the paired tensioning members 33, 34 is tensioned by the paired tensioning members 33, 34. After this, the paired tensioning members 33, 34 are further moved toward the intermediate product 50 and thus the lid member 21 is pressed against the protrusions 44 of the intermediate product 50. In this manner, the tensioned section 21c of the lid member 21 that is present between the paired tensioning members 33, 34 can be pressed at a predetermined pressure against the intermediate product 50.

A Modification Relating to an Irradiating Direction of Light

Figure 14:
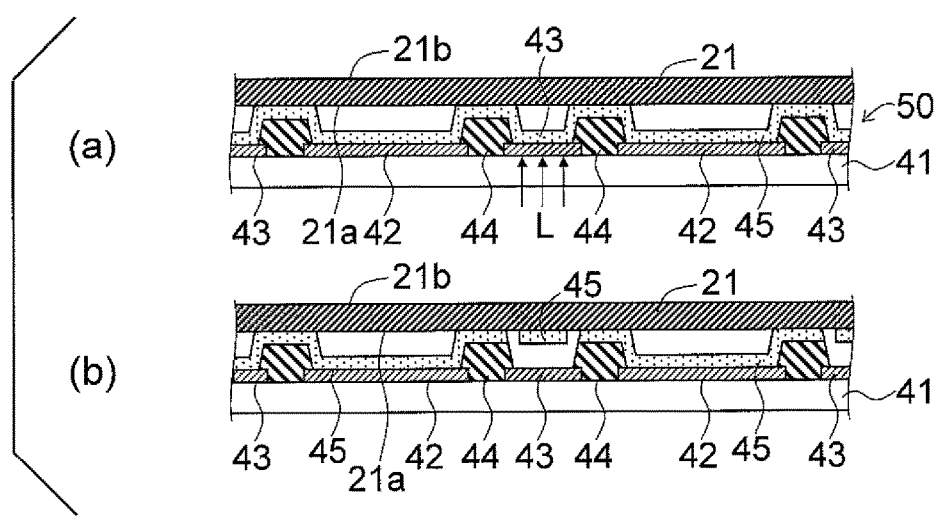
FIG. 14(a) and FIG. 14(b) show an example in which the organic semiconductor layer is irradiated with light from the side of the substrate.

The examples where the light L is emitted from the direction of the lid member 21, toward the organic semiconductor layer 45 provided on the auxiliary electrode 43, have been shown and described in the above embodiments and modifications. The direction in which the light L is emitted, however, is not limited as long as the organic semiconductor layer 45 can be appropriately heated. For example as shown in FIG. 14(a), the light L may be emitted from the direction of the substrate 41 within the intermediate product 50, toward the lid member 21 in close contact with the intermediate product 50. The auxiliary electrode 43 here is commonly constituted by one metallic element or an alloy of metallic elements. The light L that has been emitted toward the lid member 21 in close contact with the intermediate product 50 is therefore shielded primarily by the auxiliary electrode 43. In this case, light of a wavelength allowing the auxiliary electrode 43 to absorb the light L can be used to heat the auxiliary electrode 43 and thus heat the organic semiconductor layer 45 on the auxiliary electrode 43. Consequently, as shown in FIG. 14(b), the organic semiconductor layer 45 on the auxiliary electrode 43 can be evaporated and stuck to the first surface 21a of the lid member 21. If the light L is predetermined, the material constituting the auxiliary electrode 43 can be one capable of absorbing the light L.

Other Modifications

The examples where, when the plurality of intermediate products 50 lined up in the first direction D1 are irradiated with the light L in order, the stage 18 moves in the moving direction T1 of the stage and the optical head 26 of the irradiation mechanism 25 remains at rest, have been shown and described in the above embodiments and modifications. The present invention, however, is not limited to these examples and when the plurality of intermediate products 50 lined up in the first direction D1 are irradiated with the light L in order, the stage 18 may remain at rest and the optical head 26 may move in the first direction D1.

The example where the stage 18 is used as a mechanism for supporting the intermediate product 50 has been shown and described in the above embodiments and modifications. A more specific configuration of the mechanism for supporting the intermediate product 50, however, is not limited as long as the intermediate product 50 can be appropriately supported when the lid member 21 is closely fitted to the intermediate product 50. For example, if or when the intermediate product 50 is supplied and transported in roll-to-roll form, the unwinder that unwinds the intermediate product 50, the take-up section that takes up the intermediate product 50, the transport roll that comes into contact with the intermediate product 50 being transported, a guide roll, and the like may function together as a mechanism for supporting the intermediate product 50. If or when the intermediate product 50 is supplied and transported in roll-to-roll form, the substrate 41 of the intermediate product 50 extends in long-size form and the first electrodes 42, auxiliary electrodes 43, protrusions 44, organic semiconductor layer 45, second electrode 46, and other elements of the intermediate product 50 are formed on the substrate 41 extending in the long-size form.

The example where the organic semiconductor element 40 is an organic EL element has been shown and described in the above embodiments and modifications. However, this does not limit a type of the organic semiconductor element manufactured using the above-described element manufacturing apparatus 10 and element manufacturing method. For example, various organic semiconductor elements such as organic transistor devices and organic solar-cell devices can be manufactured using the element manufacturing apparatus 10 and the element manufacturing method. The organic semiconductor layers and other constituent elements used in organic transistor devices can be known ones, for example, that described in JP2009-87996A. In addition, the organic semiconductor layers and the other elements in an organic solar cell device can be known ones, for example, those described in JP2011-151195A. In addition, the element manufacturing apparatus 10 and the element manufacturing method may be applied to manufacturing inorganic semiconductor elements as well as to organic semiconductor elements.

The example where the constituent elements of the intermediate product processing device 15 are arranged inside the chamber maintained in a vacuum atmosphere has been shown and described in the above embodiments and modifications. That is to say, the example where the step of irradiating the intermediate product 50 with light by use of the intermediate product processing device 15 is executed under a vacuum environment has been shown and described. The example, however, is not intended to limit applications of the present invention, and the step of irradiating the intermediate product 50 with light by use of the intermediate product processing device 15 may be executed under a non-vacuum environment such as an atmospheric pressure environment.

While several modifications of the embodiments have been described, naturally these modifications may also be applied in combination as appropriate.

DESCRIPTION OF REFERENCE NUMBERS

10: Element manufacturing apparatus
15: Intermediate product processing device
18: Stage
18a: Mounting surface
18b: Protruded region
20: Lid member supply mechanism
21: Lid member
25: Irradiation mechanism
26: Optical head
27: Rail
30: Sealing mechanism
31: First roller
32: Second roller
40: Organic semiconductor element
41: Substrate
42: First electrode
43: Auxiliary electrode
44: Protrusion
45: Organic semiconductor layer
46: Second electrode
50: Intermediate product

The invention claimed is:

1. An element manufacturing method for forming an element on a substrate, the method comprising the steps of:
providing an intermediate product including the substrate and a plurality of protrusions each disposed on the substrate;
providing a lid member having a first surface and a second surface present at an opposite side with respect to the first surface, the lid member being provided so that the first surface orients toward the protrusions of the intermediate product; and
sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein:
the sealing mechanism includes one pair of tensioning members spacedly lined up;

in the sealing step, a section of the lid member that is being tensioned between the paired tensioning members is in close contact with the part of the intermediate product;

the element manufacturing method comprises an irradiation step in which a section of the lid member that is being tensioned between the paired tensioning members is irradiated with light; and in the irradiation step, the light passes through the section of the lid member that is being tensioned between the paired tensioning members, and reaches the intermediate product.

2. The element manufacturing method according to claim 1, wherein:

the paired tensioning members of the sealing mechanism include one pair of rollers; and in the sealing step, a section of the lid member that is being tensioned between the paired rollers is in close contact with a part of the intermediate product.

3. The element manufacturing method according to claim 2, wherein:

in the irradiation step, the light is guided by an optical system fixed with respect to rotation of the paired rollers, passes through the lid member, and reaches the intermediate product.

4. The element manufacturing method according to claim 1, wherein:

the sealing mechanism further includes an intermediate film disposed between the paired tensioning members and the lid member; and the intermediate film is formed from a material having a coefficient of elasticity that is higher than that of a material constituting the lid member.

5. The element manufacturing method according to claim 1, wherein:

the lid member includes a first film, a second film, and a sealing member disposed between the first film and the second film and functioning to seal, from outside, a space present between the first film and the second film;

the space between the first film and the second film is sealed with a gaseous substance in advance; and the sealing step is executed under an environment having a pressure lower than atmospheric pressure.

6. The element manufacturing method according to claim 1, wherein:

the element includes the substrate, a plurality of first electrodes each disposed on the substrate, auxiliary electrodes each disposed between any two of the first electrodes, the protrusions also each disposed between any two of the first electrodes, an organic semiconductor layer disposed on the first electrodes, and a second electrode disposed on the organic semiconductor layer and the auxiliary electrodes;

the intermediate product includes the substrate, the first electrodes disposed on the substrate, the auxiliary electrodes and protrusions each disposed between any two of the first electrodes, and the organic semiconductor layer disposed on the first electrodes and the auxiliary electrodes; and the organic semiconductor layer disposed on one of the auxiliary electrodes is removed while the section of the lid member that is being tensioned between the paired tensioning members is in close contact with a part of the intermediate product.

7. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein:

the sealing mechanism includes one pair of tensioning members spacedly lined up;

in the sealing step, a section of the lid member that is being tensioned between the paired tensioning members is in close contact with the part of the intermediate product;

the element manufacturing method comprises an irradiation step in which a section of the lid member that is being tensioned between the paired tensioning members is irradiated with light; and in the irradiation step, the lid member being tensioned between the paired tensioning members is irradiated with the light emitted from a direction of the substrate within the intermediate product.

8. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product under a vacuum environment by use of a sealing mechanism abutting the second surface of the lid member, and thereby bringing the part of the intermediate product into close contact with the first surface of the lid member, wherein:

the sealing mechanism includes one pair of tensioning members spacedly lined up; and in the sealing step, a section of the lid member that is being tensioned between the paired tensioning members is in close contact with the part of the intermediate product.

9. The element manufacturing method according to claim 8, wherein:

a vapor deposition material is disposed on the first surface of the lid member;

a metallic thin film including a magnetic material is disposed between the first surface of the lid member and the vapor deposition material; and in the sealing step, magnetic fields are generated around the lid member or a magnetic body is placed at an opposite side of the intermediate product with respect to the lid member, thereby to generate a magnetic force that draws the lid member toward the intermediate product.

10. The element manufacturing method according to claim 9, wherein:

the sealing mechanism further includes an intermediate film disposed between the paired tensioning members and the lid member;

the intermediate film is formed from a material having a coefficient of elasticity that is higher than that of a material constituting the lid member; and the intermediate film and the lid member are configured to be separated from each other and then recovered separately.

11. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product under a vacuum environment by use of a sealing mechanism abutting the second surface of the lid member, and thereby bringing the part of the intermediate product into close contact with the first surface of the lid member, wherein:

the sealing mechanism includes one pair of tensioning members spacedly lined up;

in the sealing step, a section of the lid member that is being tensioned between the paired tensioning members is in close contact with the part of the intermediate product;

the sealing mechanism further includes an intermediate film disposed between the paired tensioning members and the lid member;

the intermediate film is formed from a material having a coefficient of elasticity that is higher than that of a material constituting the lid member;

the intermediate film and the lid member are configured to be separated from each other and then recovered separately; and a thickness of the intermediate film is increased above that of the lid member.

12. The element manufacturing method according to claim 11, wherein:

in the sealing step, a section of the first surface of the lid member is pressed against a section of the intermediate product under a vacuum environment; and a vapor deposition material is disposed on the first surface of the lid member.

13. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein:

the sealing mechanism includes one pair of tensioning members spacedly lined up;

in the sealing step, a section of the lid member that is being tensioned between the paired tensioning members is in close contact with the part of the intermediate product;

the sealing mechanism further includes an intermediate film disposed between the paired tensioning members and the lid member;

the intermediate film and the lid member are configured to be separated from each other and then recovered separately;

a vapor deposition material is disposed on the first surface of the lid member; and a light absorbing metallic thin film is disposed between the first surface of the lid member and the vapor deposition material.

14. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein:

the sealing mechanism includes one pair of tensioning members spacedly lined up;

in the sealing step, a section of the lid member that is being tensioned between the paired tensioning members is in close contact with the part of the intermediate product;

the lid member includes a first film, a second film, and a sealing member disposed between the first film and the second film and functioning to seal, from outside, a space present between the first film and the second film;

the space between the first film and the second film is sealed with a gaseous substance in advance; and the sealing step is executed under an environment having a pressure lower than atmospheric pressure.

15. An element manufacturing method for forming an element on a substrate, the method comprising the steps of:

providing an intermediate product including the substrate and a plurality of protrusions each disposed on the substrate;

providing a lid member having a first surface and a second surface present at an opposite side with respect to the first surface, the lid member being provided so that the first surface orients toward the protrusions of the intermediate product; and sealing the intermediate product by pressing a part of the first surface of the lid member against a part of the intermediate product by use of a sealing mechanism abutting the second surface of the lid member, and thereby bringing the part of the intermediate product into close contact with the first surface of the lid member, wherein:

the sealing mechanism includes one pair of tensioning members spacedly lined up;

in the sealing step, a section of the lid member that is being tensioned between the paired tensioning members is in close contact with the part of the intermediate product;
the element includes the substrate, a plurality of first electrodes each disposed on the substrate, auxiliary electrodes each disposed between any two of the first electrodes, the protrusions also each disposed between any two of the first electrodes, an organic semiconductor layer disposed on the first electrodes, and a second electrode disposed on the organic semiconductor layer and the auxiliary electrodes;
the intermediate product includes the substrate, the first electrodes disposed on the substrate, the auxiliary electrodes and protrusions each disposed between any two of the first electrodes, and the organic semiconductor layer disposed on the first electrodes and the auxiliary electrodes; and
the organic semiconductor layer disposed on one of the auxiliary electrodes is removed while the section of the lid member that is being tensioned between the paired tensioning members is in close contact with a part of the intermediate product.

16. An element manufacturing apparatus for forming an element on a substrate, the apparatus comprising:
a support mechanism that supports an intermediate product including the substrate and a plurality of protrusions each disposed on the substrate;
a lid member supply mechanism that supplies a lid member having a first surface and a second surface present at an opposite side relative to the first surface, the lid member being provided so that the first surface orients toward the protrusions of the intermediate product; and
a sealing mechanism that presses a part of the first surface of the lid member against a part of the intermediate product by abutting the second surface of the lid member, and thereby brings the part of the intermediate product into close contact with the first surface of the lid member, wherein:
the sealing mechanism includes one pair of tensioning members;
the paired tensioning members are arranged spacedly so that a section of the lid member that is being tensioned between the paired tensioning members comes into close contact with the part of the intermediate product;
the element manufacturing apparatus comprises an irradiation mechanism to irradiate with light a section of the lid member that is being tensioned between the paired tensioning members; and
the light passes through the section of the lid member that is being tensioned between the paired tensioning members, and reaches the intermediate product.

17. The element manufacturing apparatus according to claim 16, wherein:
the paired tensioning members of the sealing mechanism include one pair of rollers; and
a section of the lid member that is being tensioned between the paired rollers comes into close contact with a part of the intermediate product.

18. The element manufacturing apparatus according to claim 17 wherein
the irradiation mechanism includes an optical system that guides the light so that the light will pass through the lid member and reach the intermediate product; and
the optical system is fixed with respect to the rotation of the paired rollers.

19. The element manufacturing apparatus according to claim 16, wherein:
the sealing mechanism further includes an intermediate film disposed between the paired tensioning members and the lid member; and
the intermediate film is formed from a material having a coefficient of elasticity that is higher than that of a material constituting the lid member.

20. An element manufacturing apparatus for forming an element on a substrate, the apparatus comprising:
a support mechanism that supports an intermediate product including the substrate and a plurality of protrusions each disposed on the substrate;
a lid member supply mechanism that supplies a lid member having a first surface and a second surface present at an opposite side relative to the first surface, the lid member being provided so that the first surface orients toward the protrusions of the intermediate product; and
a sealing mechanism that presses a part of the first surface of the lid member against a part of the intermediate product by abutting the second surface of the lid member, and thereby brings the part of the intermediate product into close contact with the first surface of the lid member, wherein:
the sealing mechanism includes one pair of tensioning members;
the paired tensioning members are arranged spacedly so that a section of the lid member that is being tensioned between the paired tensioning members comes into close contact with the part of the intermediate product;
the element manufacturing apparatus comprises an irradiation mechanism to irradiate with light a section of the lid member that is being tensioned between the paired tensioning members; and
the lid member being tensioned between the paired tensioning members is irradiated with the light emitted from a direction of the substrate within the intermediate product.

21. An element manufacturing apparatus for forming an element on a substrate, the apparatus comprising:
a support mechanism that supports an intermediate product including the substrate and a plurality of protrusions each disposed on the substrate;
a lid member supply mechanism that supplies a lid member having a first surface and a second surface present at an opposite side relative to the first surface, the lid member being provided so that the first surface orients toward the protrusions of the intermediate product; and
a sealing mechanism that presses a part of the first surface of the lid member against a part of the intermediate product under a vacuum environment by abutting the second surface of the lid member, and thereby brings the part of the intermediate product into close contact with the first surface of the lid member, wherein:
the sealing mechanism includes one pair of tensioning members;
the paired tensioning members are arranged spacedly so that a section of the lid member that is being tensioned between the paired tensioning members comes into close contact with the part of the intermediate product.

22. The element manufacturing apparatus according to claim 21, wherein:
a vapor deposition material is disposed on the first surface of the lid member;

a metallic thin film including a magnetic material is disposed between the first surface of the lid member and the vapor deposition material; and when the sealing mechanism brings the part of the intermediate product into close contact with the first surface of the lid member, magnetic fields are generated around the lid member or a magnetic body is placed at an opposite side of the intermediate product with respect to the lid member, thereby to generate a magnetic force that draws the lid member toward the intermediate product.

23. The element manufacturing apparatus according to claim 21, wherein:
the sealing mechanism further includes an intermediate film disposed between the paired tensioning members and the lid member;
the intermediate film is formed from a material having a coefficient of elasticity that is higher than that of a material constituting the lid member; and
the intermediate film and the lid member are configured to be separated from each other and then recovered separately.

24. An element manufacturing apparatus for forming an element on a substrate, the apparatus comprising:
a support mechanism that supports an intermediate product including the substrate and a plurality of protrusions each disposed on the substrate;
a lid member supply mechanism that supplies a lid member having a first surface and a second surface present at an opposite side relative to the first surface, the lid member being provided so that the first surface orients toward the protrusions of the intermediate product; and
a sealing mechanism that presses a part of the first surface of the lid member against a part of the intermediate product by abutting the second surface of the lid member, and thereby brings the part of the intermediate product into close contact with the first surface of the lid member, wherein:
the sealing mechanism includes one pair of tensioning members;
the paired tensioning members are arranged spacedly so that a section of the lid member that is being tensioned between the paired tensioning members comes into close contact with the part of the intermediate product;
the sealing mechanism further includes an intermediate film disposed between the paired tensioning members and the lid member; and
the intermediate film is formed from a material having a coefficient of elasticity that is higher than that of a material constituting the lid member;
the intermediate film and the lid member are configured to be separated from each other and then recovered separately; and
a thickness of the intermediate film is increased above that of the lid member.

25. The element manufacturing apparatus according to claim 24, wherein:
the sealing mechanism presses the section of the first surface of the lid member against the section of the intermediate product under a vacuum environment; and
a vapor deposition material is disposed on the first surface of the lid member.

26. An element manufacturing apparatus for forming an element on a substrate, the apparatus comprising:
a support mechanism that supports an intermediate product including the substrate and a plurality of protrusions each disposed on the substrate;
a lid member supply mechanism that supplies a lid member having a first surface and a second surface present at an opposite side relative to the first surface, the lid member being provided so that the first surface orients toward the protrusions of the intermediate product; and
a sealing mechanism that presses a part of the first surface of the lid member against a part of the intermediate product by abutting the second surface of the lid member, and thereby brings the part of the intermediate product into close contact with the first surface of the lid member, wherein:
the sealing mechanism includes one pair of tensioning members;
the paired tensioning members are arranged spacedly so that a section of the lid member that is being tensioned between the paired tensioning members comes into close contact with the part of the intermediate product;
the sealing mechanism further includes an intermediate film disposed between the paired tensioning members and the lid member;
the intermediate film and the lid member are configured to be separated from each other and then recovered separately;
a vapor deposition material is disposed on the first surface of the lid member; and
a light absorbing metallic thin film is disposed between the first surface of the lid member and the vapor deposition material.

* * * * *